US012794439B2

(12) United States Patent
Koulakis

(10) Patent No.: US 12,794,439 B2
(45) Date of Patent: Nov. 10, 2026

(54) TRANSVERSELY-EXCITED FILM BULK ACOUSTIC RESONATOR WITH OXIDE STRIP AND DUMMY FINGERS

(71) Applicant: Murata Manufacturing Co., Ltd., Nagaokakyo (JP)

(72) Inventor: John P. Koulakis, Los Angeles, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 849 days.

(21) Appl. No.: 18/193,269

(22) Filed: Mar. 30, 2023

(65) Prior Publication Data

US 2023/0336142 A1 Oct. 19, 2023

Related U.S. Application Data

(60) Provisional application No. 63/331,690, filed on Apr. 15, 2022.

(51) Int. Cl.
*H03H 9/02* (2006.01)
*H03H 9/17* (2006.01)
*H03H 9/56* (2006.01)

(52) U.S. Cl.
CPC ........ *H03H 9/02228* (2013.01); *H03H 9/174* (2013.01); *H03H 9/564* (2013.01)

(58) Field of Classification Search
CPC .... H03H 9/02228; H03H 9/174; H03H 9/564; H03H 2003/023; H03H 3/02;
(Continued)

(56) References Cited

U.S. PATENT DOCUMENTS 5,705,399 A 1/1998 Larue
5,853,601 A 12/1998 Krishaswamy et al.
(Continued)

FOREIGN PATENT DOCUMENTS

WO 2016017104 2/2016
WO 2018003273 A1 1/2018

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Jorge L Salazar, Jr.
(74) *Attorney, Agent, or Firm* — ArentFox Schiff LLP

(57) ABSTRACT

An acoustic resonator includes a substrate, a piezoelectric plate supported by the substrate, and a diaphragm. The resonator further includes an interdigital transducer (IDT) having interleaved IDT fingers extending from first and second busbars respectively. Overlapping portions of the interleaved IDT fingers define an aperture of the acoustic resonator. The resonator further includes one or more dielectric strips, each of the one or more dielectric strips overlapping at least a portion of the IDT fingers and extending into a gap between a margin of the aperture and a corresponding one of the first busbar or the second busbar. The resonator further includes one or more dummy fingers, each of the dummy fingers extending from one of the first busbar or the second busbar at a position between neighboring IDT fingers and extending into the gap toward one of the one or more dielectric strips.

18 Claims, 16 Drawing Sheets

(58) Field of Classification Search
CPC .... H03H 9/02015; H03H 9/132; H03H 9/171; H03H 9/13; H03H 9/54
USPC .................................................. 333/193–196
See application file for complete search history.

(56) References Cited

U.S. PATENT DOCUMENTS

| | | | | |
|---|---|---|---|---|
| 6,540,827 | B1 | 4/2003 | Levy et al. | |
| 6,707,229 | B1 | 3/2004 | Martin | |
| 7,463,118 | B2 | 12/2008 | Jacobsen | |
| 7,535,152 | B2 | 5/2009 | Ogami et al. | |
| 7,684,109 | B2 | 3/2010 | Godshalk et al. | |
| 7,802,466 | B2 | 9/2010 | Whalen et al. | |
| 7,868,519 | B2 | 1/2011 | Umeda | |
| 8,278,802 | B1 | 10/2012 | Lee et al. | |
| 8,344,815 | B2 | 1/2013 | Yamanaka | |
| 8,829,766 | B2 | 9/2014 | Milyutin et al. | |
| 8,932,686 | B2 | 1/2015 | Hayakawa et al. | |
| 9,130,145 | B2 | 9/2015 | Martin et al. | |
| 9,219,466 | B2 | 12/2015 | Meltaus et al. | |
| 9,276,557 | B1 | 3/2016 | Nordquist et al. | |
| 9,369,105 | B1 | 6/2016 | Li | |
| 9,425,765 | B2 | 8/2016 | Rinaldi | |
| 9,525,398 | B1 | 12/2016 | Olsson | |
| 9,748,923 | B2 | 8/2017 | Kando et al. | |
| 9,748,924 | B2 * | 8/2017 | Komatsu | H10N 30/87 |
| 9,780,759 | B2 | 10/2017 | Kimura et al. | |
| 10,200,013 | B2 | 2/2019 | Bower et al. | |
| 10,491,192 | B1 | 11/2019 | Plesski et al. | |
| 10,601,392 | B2 | 3/2020 | Plesski et al. | |
| 10,637,438 | B2 | 4/2020 | Garcia et al. | |
| 10,756,697 | B2 | 8/2020 | Plesski et al. | |
| 10,790,802 | B2 | 9/2020 | Yantchev et al. | |
| 10,797,675 | B2 | 10/2020 | Plesski | |
| 10,826,462 | B2 | 11/2020 | Plesski et al. | |
| 2002/0079986 | A1 | 6/2002 | Ruby et al. | |
| 2002/0158714 | A1 | 10/2002 | Kaitila et al. | |
| 2003/0199105 | A1 | 10/2003 | Kub et al. | |
| 2004/0261250 | A1 | 12/2004 | Kadota et al. | |
| 2006/0125489 | A1 | 6/2006 | Feucht et al. | |
| 2006/0222568 | A1 | 10/2006 | Wang et al. | |
| 2007/0194863 | A1 | 8/2007 | Shibata et al. | |
| 2010/0064492 | A1 | 3/2010 | Tanaka | |
| 2010/0123367 | A1 | 5/2010 | Tai et al. | |
| 2011/0109196 | A1 | 5/2011 | Goto | |
| 2011/0278993 | A1 | 11/2011 | Iwamoto | |
| 2013/0015353 | A1 | 1/2013 | Tai et al. | |
| 2013/0234805 | A1 | 9/2013 | Takahashi | |
| 2013/0321100 | A1 | 12/2013 | Wang | |
| 2014/0145556 | A1 | 5/2014 | Kadota | |
| 2014/0151151 | A1 | 6/2014 | Reinhardt | |
| 2014/0152145 | A1 | 6/2014 | Kando et al. | |
| 2014/0173862 | A1 | 6/2014 | Kando et al. | |
| 2014/0225684 | A1 | 8/2014 | Kando et al. | |
| 2015/0319537 | A1 | 11/2015 | Perois et al. | |
| 2015/0333730 | A1 | 11/2015 | Meltaus | |
| 2016/0028367 | A1 | 1/2016 | Shealy | |
| 2016/0182009 | A1 | 6/2016 | Bhattacharjee | |
| 2017/0063332 | A1 | 3/2017 | Gilbert et al. | |
| 2017/0179928 | A1 | 6/2017 | Raihn et al. | |
| 2017/0214387 | A1 | 7/2017 | Burak et al. | |
| 2017/0222622 | A1 | 8/2017 | Solal et al. | |
| 2017/0370791 | A1 | 12/2017 | Nakamura et al. | |
| 2018/0123016 | A1 | 5/2018 | Gong et al. | |
| 2018/0191322 | A1 | 7/2018 | Chang et al. | |
| 2019/0068164 | A1 | 2/2019 | Houlden et al. | |
| 2019/0131953 | A1 | 5/2019 | Gong | |
| 2019/0273480 | A1 | 9/2019 | Lin | |
| 2023/0336143 | A1 * | 10/2023 | Kimura | H03H 9/02228 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHz Lithium Niobate MEMS Resonators With High Fom of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary "Meaning of diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

"Acoustic Properties of Solids" ONDA Corporation, 592 Weddell Drive, Sunnyvale, CA 94089, Apr. 11, 2003, pp. 5 (Year 2003).

Bahreynl, B., "Fabrication and Design of Resonant Microdevices" Andrew William, Inc. 2018, NY (Year 2008).

Material Properties of Tibtech Innovations, © 2018 Tibtech Innovations (Year 2018).

Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.

Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).

Yantchev, Ventsislav & Katardjiev, Ilia. (2013). Thin film Lamb wave resonators in frequency control and sensing applications: A review. Journal of Micromechanics and Microengineering. 23. 043001. 10.1088/0960-1317/23/4/043001.

Wei Pang et al. "Analytical and experimental study on the second harmonic mode response of a bulk acoustic wave resonator" 2010 J. Micromech. Microeng. 20 115015; doi:10.1088/0960-1317/20/11/115015.

Durmus et al. "Acoustic-Based Biosensors" Encyclopedia of Microfluidics and Nanofluidics. DOI 10.1007/978-3-642-27758-0_10-2 Springer Science+Business Media New York 2014.

* cited by examiner

Notes: Only one of actions 1210A, 1210B, 1210C is performed in each of three variations of the process 1200.

TRANSVERSELY-EXCITED FILM BULK ACOUSTIC RESONATOR WITH OXIDE STRIP AND DUMMY FINGERS

CROSS REFERENCE TO RELATED APPLICATIONS

The current application claims priority to U.S. Patent Provisional Application No. 63/331,690, filed on Apr. 15, 2022, the entire contents of which is hereby incorporated by reference.

TECHNICAL FIELD

This disclosure relates to transversely-excited film bulk acoustic resonators (XBARs), including XBARs including a wide oxide strip and dummy fingers used in combination to achieve lower loss near the anti-resonance frequency of the XBARs.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels. As the demand for RF filters operating at higher frequencies continues to increase, there is a need for improved filters that can operate at different frequency bands while also improving the manufacturing processes for making such filters.

SUMMARY

Thus, according to a described aspect, an acoustic resonator is provided that includes a substrate and a piezoelectric plate supported by the substrate. The acoustic resonator further includes a diaphragm including a portion of the piezoelectric plate spanning a cavity in the substate, as well as an interdigital transducer (IDT) at the piezoelectric plate. The IDT includes interleaved IDT fingers extending from first and second busbars respectively, where overlapping portions of the interleaved IDT fingers define an aperture of the acoustic resonator. The acoustic resonator also includes one or more dielectric strips, each of the dielectric strips overlapping at least a portion of each of the IDT fingers and extending into a gap between a margin of the aperture and a corresponding one of the first busbar or the second busbar. The acoustic resonator further includes one or more dummy fingers, each of the dummy fingers extending from one of the first busbar or the second busbar at a position between neighboring IDT fingers and extending into the gap toward one of the one or more dielectric strips.

According to another described aspect, a filter device is provided that includes a substrate and a piezoelectric plate supported by the substrate. The filter device further includes a plurality of diaphragms, each diaphragm including a respective portion of the piezoelectric plate spanning a respective cavity in the substrate. The filter device also includes a conductor pattern at the piezoelectric plate, the conductor pattern including interdigital transducers (IDTs) of a plurality of acoustic resonators. Each IDT includes interleaved IDT fingers extending from first and second busbars respectively. The interleaved IDT fingers are on a respective diaphragm and overlapping portions of the interleaved IDT fingers define an aperture of a respective acoustic resonator of the acoustic resonators. At least one of the acoustic resonators further includes one or more dielectric strips, each of the one or more dielectric strips overlapping at least a portion of each of the IDT fingers of the at least one of the acoustic resonators and extending into a gap between a margin of the aperture of the at least one of the acoustic resonators and a corresponding one of the first busbar or the second busbar. The acoustic resonator also includes one or more dummy fingers, each of the dummy fingers extending from one of the first busbar or the second busbar at a position between neighboring IDT fingers and extending into the gap toward one of the one or more dielectric strips of the at least one of the acoustic resonators.

According to another aspect, a method of fabricating an acoustic resonator includes forming an interdigital transducer (IDT) at a piezoelectric plate, the IDT including interleaved IDT fingers extending from first and second busbars respectively. The interleaved IDT fingers are on a diaphragm including a portion of the piezoelectric plate spanning a cavity in a substrate, and overlapping portions of the interleaved IDT fingers define an aperture of the acoustic resonator. The method also includes forming one or more dielectric strips that each overlap at least a portion of each of the IDT fingers and extend into a gap between a margin of the aperture and a corresponding one of the first busbar or the second busbar. Forming of the IDT further includes forming one or more dummy fingers, each of the dummy fingers extending from one of the first busbar or the second busbar at a position between neighboring IDT fingers and extending into the gap toward one of the one or more dielectric strips.

The above simplified summary of example aspects serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows.

Throughout this description, elements appearing in figures are assigned three-digit or four-digit reference designators, where the two least significant digits are specific to the element and the one or two most significant digit is the corresponding figure number. An element that is not described in conjunction with a figure may be presumed to have the same characteristics and function as a previously-described element having the same element-specific digits.

DETAILED DESCRIPTION

Figure 1A:
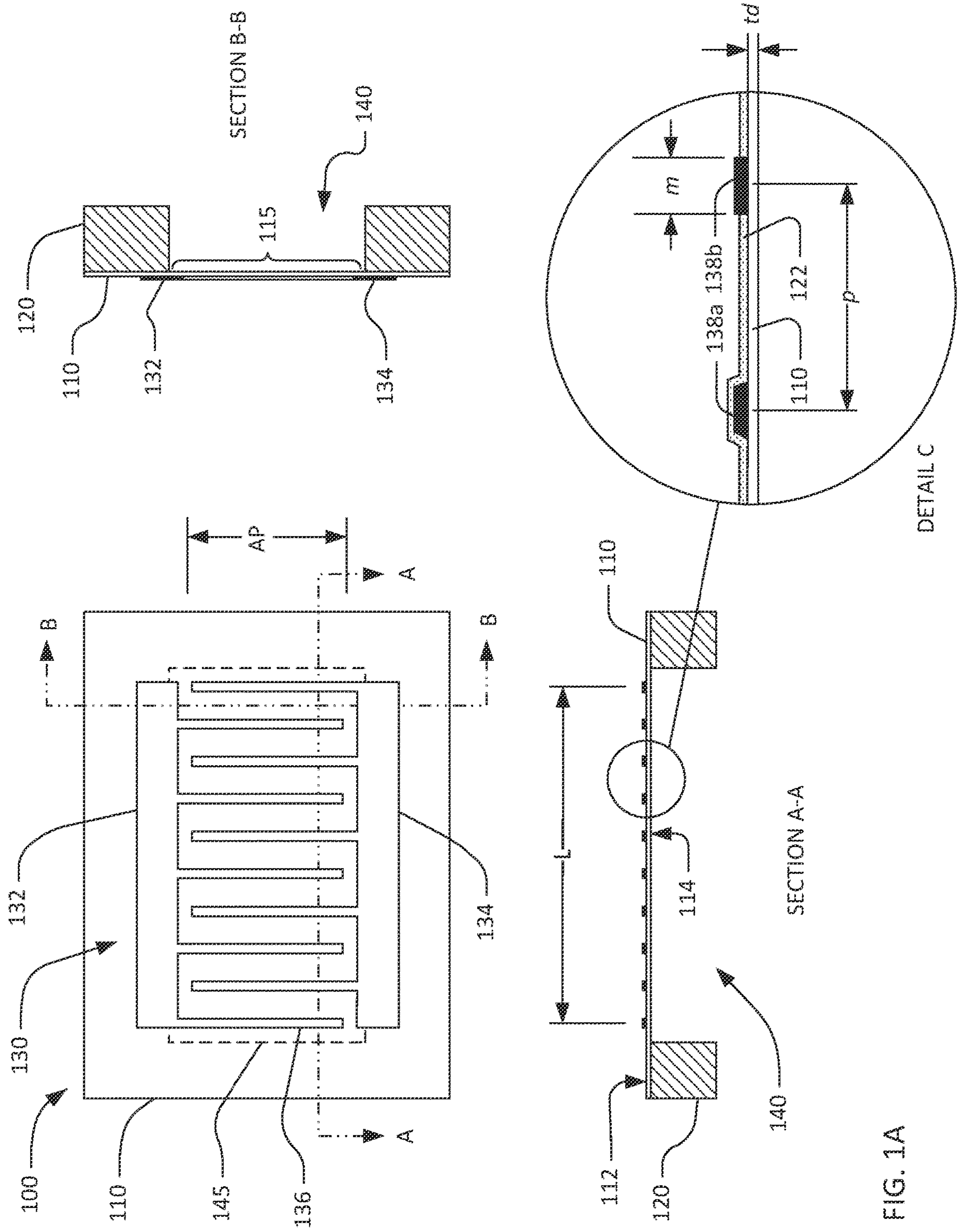
FIG. 1A includes a schematic plan view, two schematic cross-sectional views, and a detail view of a transversely-excited film bulk acoustic resonator (XBAR).

FIG. 1A shows a simplified schematic top view, orthogonal cross-sectional views, and a detailed cross-sectional view of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate may be a thin single-crystal layer of a piezoelectric material such as lithium niobate, lithium tantalate, lanthanum gallium silicate, gallium nitride, or aluminum nitride. The piezoelectric plate may be cut such that the orientation of the X, Y, and Z crystalline axes with respect to the front and back surfaces is known and consistent. In the examples presented in this disclosure, the piezoelectric plate may be Z-cut, which is to say the Z axis is normal to the front and back surfaces 112, 114.

In some of the foregoing aspects, the piezoelectric plate 110 may be 82Y-cut, for example 82Y-cut lithium niobate with Euler angles in the range (0, x, 90) with $-15<x<0$. As is understood in the art, a "cut" usually defines two things: 1) the plane of the crystal that is exposed, and 2) the direction of travel of the acoustic wave used (i.e., the direction perpendicular to the IDT fingers). The Y-cut family, such as 120Y and 128Y, are typically referred to as 120YX or 128YX, where the "cut angle" is the angle between the y axis and the normal to the plate. The "cut angle" is equal to $\beta+90°$. For example, a plate with Euler angles [0°, 30°, 0° ] is commonly referred to as "120° rotated Y-cut". Thus, the Euler angles for 120YX and 128YX are (0, 120-90, 0) and (0, 128-90, 0) respectively. A "Z-cut" is typically referred to as a ZY cut and is understood to mean that the plate surface is normal to the Z axis but the wave travels along the Y axis. The Euler angles for ZY cut are (0, 0, 90). As used herein, an 82Y-cut is a variation of a Z-cut. The Euler angles for 82Y-cut are (0, 82-90, 90). The normal to the crystal face in an 82Y-cut is defined similarly to how a 120Y-cut is defined, but the wave in an 82Y-cut travels in a direction similar to a ZY-cut (i.e., along the Y axis, meaning that the IDT is aligned differently in an 82Y-cut than an 82YX-cut). Thus, as used herein, an 82Y-cut is not the same as an 82YX-cut. However, XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1A, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1A).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The direction parallel to the IDT fingers will be referred to herein as the "aperture direction". The center-to-center distance L between the outermost fingers of the IDT 130 is the "length" of the IDT. The direction perpendicular to the IDT fingers will be referred to herein as the "length direction," while the direction of a dielectric strip, discussed in more detail below, extends into a gap between a busbar and an IDT finger of an opposing busbar, which may be in a direction parallel to the IDT fingers, may be referred to herein as the "width direction" of the dielectric strip.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate which spans, or is suspended over, the cavity 140. As shown in FIG. 1A, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

For ease of presentation in FIG. 1A, the geometric pitch and mark ("mark" is a term commonly used to refer to the dimension perpendicular to the long axis of a conductor such as an IDT finger) of the IDT fingers is greatly exaggerated with respect to the length (dimension L) and aperture (dimension AP) of the XBAR. A typical XBAR has more than ten parallel fingers in the IDT 130. An XBAR may have hundreds of parallel fingers in the IDT 130. Similarly, the thickness of the fingers in the cross-sectional views is greatly exaggerated.

Referring to the detailed cross-sectional view (Detail C), a front-side dielectric layer 122 may optionally be formed on the front side of the piezoelectric plate 110. The "front side" of the XBAR is, by definition, the surface facing away from the substrate. The front-side dielectric layer 122 may be formed only between the IDT fingers (e.g. IDT finger 138*b*) or may be deposited as a blanket layer such that the dielectric layer is formed both between and over the IDT fingers (e.g. IDT finger 138*a*). The front-side dielectric layer 122 may be a non-piezoelectric dielectric material, such as silicon dioxide or silicon nitride. The thickness of the front side dielectric layer is typically less than or equal to the thickness of the piezoelectric plate. The front-side dielectric layer 122 may be formed of multiple layers of one or more materials.

The IDT fingers 138*a* and 138*b* may be aluminum, an aluminum alloy, copper, a copper alloy, beryllium, gold, tungsten, molybdenum or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars 132, 134 of the IDT may be made of the same or different materials as the fingers.

Dimension p is the center-to-center spacing or "pitch" of the IDT fingers, which may be referred to as the pitch of the IDT and/or the pitch of the XBAR. Dimension m is the mark of the IDT fingers.

As shown in Detail C, IDT finger 138*a* has a trapezoidal cross-sectional shape and IDT finger 138*b* has a rectangular cross-sectional shape. The IDT fingers 138*a*, 138*b* may have some other cross-section, such as T-shaped or stepped. The IDT fingers 138*a*, 138*b* are shown as single layer structures which may be aluminum or some other metal. IDT fingers may include multiple layers of materials, which may be selected to have different acoustic loss and/or different acoustic impedance. When multiple material layers are used, the cross-sectional shapes of the layers may be different. Further, a thin adhesion layer of another material, such as titanium or chrome, may be formed between the IDT fingers 138*a*, 138*b* and the piezoelectric plate 110. Although not shown in FIG. 1A, some or all IDT fingers may be disposed in grooves or slots extending partially or completely through the piezoelectric plate 110.

Figure 1B:
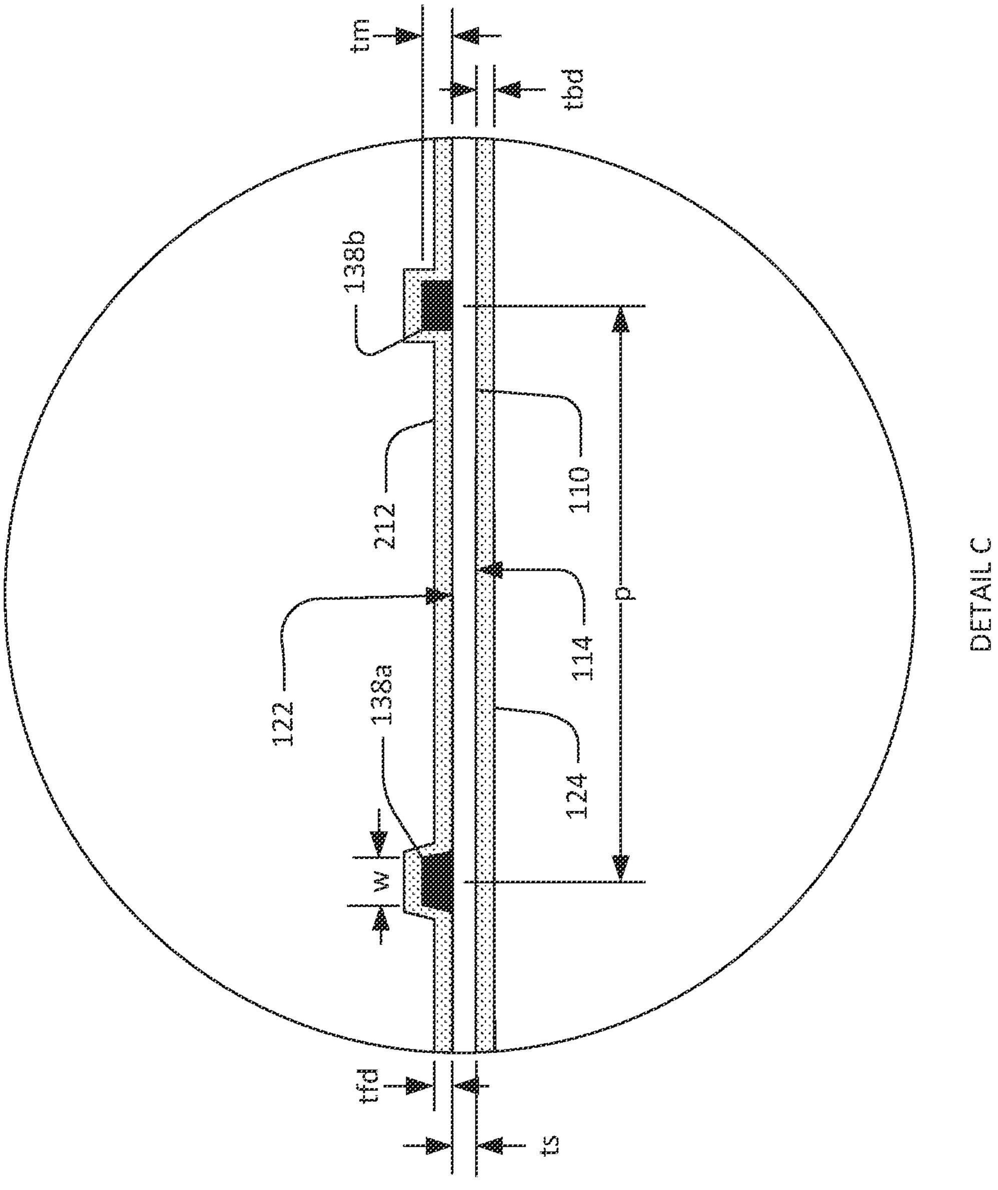
FIG. 1B is an expanded schematic cross-sectional view of a portion of the XBAR of FIG. 1A.

FIG. 1B shows a detailed schematic cross-sectional view of the XBAR 100 of FIG. 1A. The piezoelectric plate 110 is a single-crystal layer of piezoelectrical material having a thickness ts. ts may be, for example, 100 nm to 1500 nm. When used in filters for 5G NR and Wi-Fi™ bands from 3.4 GHz to 7 GHz, the thickness ts may be, for example, 150 nm to 500 nm.

A front-side dielectric layer 122 (e.g., a first dielectric coating layer or material) can be formed on the front side 112 of the piezoelectric plate 110. The "front side" of the XBAR is, by definition, the surface facing away from the substrate. The front-side dielectric layer 122 has a thickness tfd. As shown in FIG. 1B, the front-side dielectric layer 122 covers the IDT fingers 138*a*, 138*b*. Although not shown in FIG. 1B, the front side dielectric layer 122 may also be deposited only between the IDT fingers 138*a*, 138*b*. In this case, an additional thin dielectric layer (not shown) may be deposited over the IDT fingers to seal and passivate the fingers.

A back-side dielectric layer 124 (e.g., a second dielectric coating layer or material) can be formed on the back side 114 of the piezoelectric plate 110. In general, for purposes of this disclosure, the term "back-side" means on a side opposite the front-side dielectric layer 122. Moreover, the back-side dielectric layer 124 has a thickness tbd. The front-side and back-side dielectric layers 122, 124 may be a non-piezoelectric dielectric material, such as silicon dioxide or silicon nitride. tfd and tbd may be, for example, 0 to 500 nm. tfd and tbd are typically less than the thickness is of the piezoelectric plate. tfd and tbd are not necessarily equal, and the front-side and back-side dielectric layers 122, 124 are not necessarily the same material. Either or both of the front-side and back-side dielectric layers 122, 124 may be formed of multiple layers of two or more materials according to various exemplary aspects.

The IDT fingers 138*a*, 138*b* may be aluminum, substantially aluminum alloys, copper, substantially copper alloys, beryllium, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1A) of the IDT may be made of the same or different materials as the fingers. The cross-sectional shape of the IDT fingers may be trapezoidal (finger 138*a*), rectangular (finger 138*b*) or some other shape.

Figure 1D:
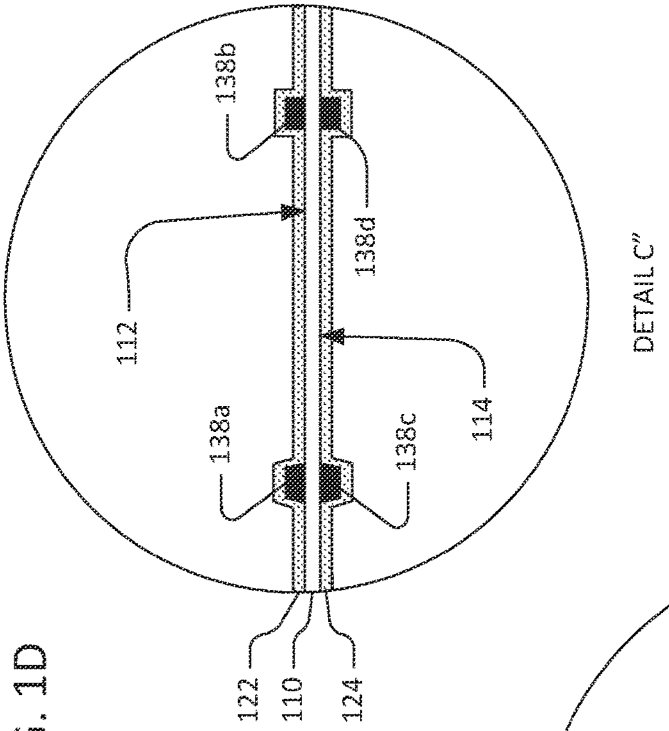
FIG. 1D is an expanded schematic cross-sectional view of another alternative configuration of the XBAR of FIG. 1A.
Figure 1E:
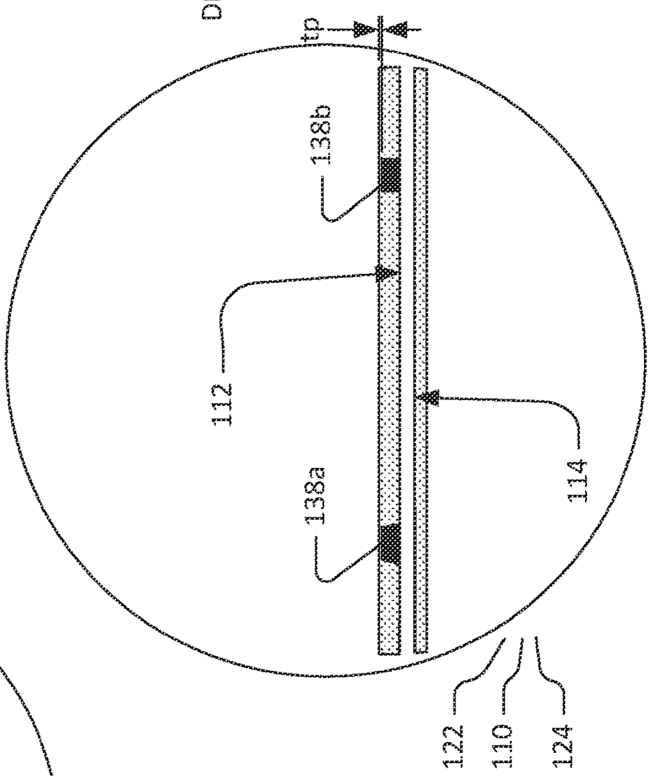
FIG. 1E is an expanded schematic cross-sectional view of another alternative configuration of the XBAR of FIG. 1A.
Figure 1C:
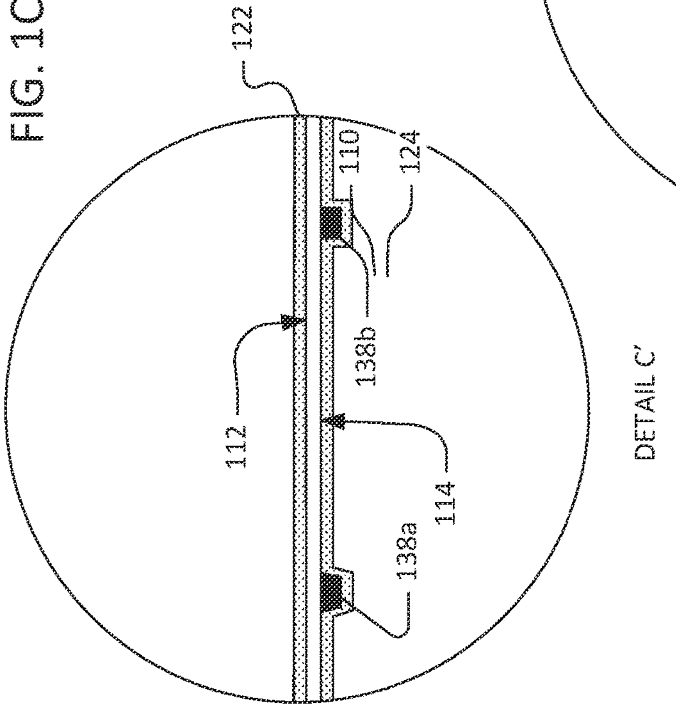
FIG. 1C is an expanded schematic cross-sectional view of an alternative configuration of the XBAR of FIG. 1A.

Dimension p is the center-to-center spacing between adjacent IDT fingers, such as the IDT fingers 138*a*, 138*b* in FIGS. 1B, 1C, and 1D. The center-to-center spacing may be constant over the length of the IDT, in which case the dimension p may be referred to as the pitch of the IDT and/or the pitch of the XBAR. The center-to-center spacing may vary along the length of the IDT, in which case the pitch of the IDT is the average value of dimension p over the length of the IDT. Each IDT finger, such as the IDT fingers 138*a*, 138*b* in FIGS. 1B, 1C, and 1D, has a width w measured normal to the long direction of each finger. The width w may also be referred to herein as the "mark." The width of the IDT fingers may be constant over the length of the IDT, in which case the dimension w is the width of each IDT finger. The width of individual IDT fingers may vary along the length of the IDT 130, in which case dimension w is the average value of the widths of the IDT fingers over the length of the IDT. Note that the pitch p and the width w of the IDT fingers are measured in a direction parallel to the length L of the IDT, as defined in FIG. 1A.

The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric plate 110. Moreover, the width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1A) of the IDT may be the same as, less than, greater than, or any combination thereof, the thickness tm of the IDT fingers.

Moreover, unlike a SAW filter, the resonance frequency of an XBAR is dependent on the total thickness of its diaphragm (i.e., in the vertical or thickness direction), including the piezoelectric plate 110, and the front-side and back-side dielectric layers 122, 124 disposed thereon. As described in more detail below, the thickness of one or both dielectric layers can be varied to change the resonance frequencies of various XBARs in a filter. For example, shunt resonators in a ladder filter circuit may incorporate thicker dielectric layers to reduce the resonance frequencies of the shunt resonators relative to series resonators with thinner dielectric layers, and thus, a thinner overall thickness.

Referring back to FIG. 1B, the thickness tfd of the front-side dielectric layer 122 over the IDT fingers 138*a*, 138*b* may be greater than or equal to a minimum thickness required to passivate the IDT fingers and other conductors on the front side 112 to the piezoelectric plate 110. The minimum thickness may be, for example, 10 nm to 50 nm depending on the material of the front side dielectric layer and method of deposition according to an exemplary aspect. The thickness of the back-side dielectric layer 124 may be configured to specific thickness to adjust the resonance frequency of the resonator as will be described in more detail below.

Although FIG. 1B discloses a configuration in which IDT fingers 138*a* and 138*b* are on the front side 112 of the piezoelectric plate 110, alternative configurations can be provided. For example, FIG. 1C shows an alternative configuration in which the IDT fingers 138*a*, 138*b* are on the back side 114 of the piezoelectric plate 110 and are covered by a back-side dielectric layer 124. A front side dielectric layer 122 may cover the front side 112 of the piezoelectric plate 110. As described below, a dielectric layer disposed on the diaphragm of each resonator can be trimmed or etched to adjust the resonant frequency. However, if the dielectric layer is on the side of the diaphragm facing the cavity, there may be a change in spurious modes (e.g., generated by the coating on the fingers), which would need to be addressed. Moreover, with the passivation layer coated on top of the IDTs, the mark changes, which can also cause spurs. Therefore, disposing the IDT fingers 138*a*, 138*b* on the back side 114 of the piezoelectric plate 110 as shown in FIG. 1C may eliminate the need to address both the change in frequency as well as the effect it has on spurs as compared when the IDT fingers 138*a* and 138*b* are on the front side 112 of the piezoelectric plate 110.

FIG. 1D shows an alternative configuration in which IDT fingers 138*a*, 138*b* are on the front side 112 of the piezoelectric plate 110 and are covered by a front-side dielectric layer 122. IDT fingers 138*c*, 138*d* are on the back side 114 of the piezoelectric plate 110 and are covered by a back-side dielectric layer 124. As previously described, the front-side and back-side dielectric layer 122, 124 are not necessarily the same thickness or the same material.

FIG. 1E shows another alternative configuration in which IDT fingers 138*a*, 138*b* are on the front side 112 of the piezoelectric plate 110 and are covered by a front-side dielectric layer 122. The surface of the front-side dielectric layer is planarized. The front-side dielectric layer may be planarized, for example, by polishing or some other method. A thin layer of dielectric material having a thickness tp may cover the IDT fingers 138*a*, 138*b* to seal and passivate the fingers. The dimension tp may be, for example, 10 nm to 50 nm.

Figure 1F:
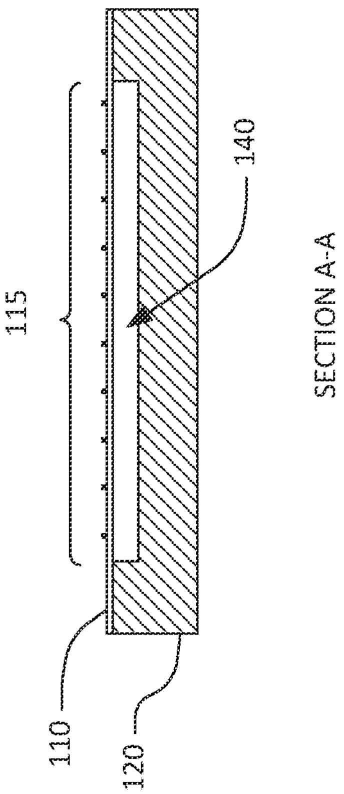
FIG. 1F is an alternative schematic cross-sectional view of the XBAR of FIG. 1A.
Figure 1G:
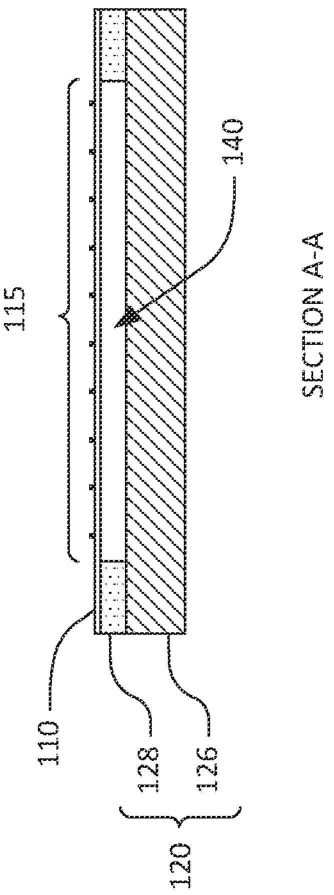
FIG. 1G is an alternative schematic cross-sectional view of the XBAR of FIG. 1A.

FIG. 1F and FIG. 1G show two alternative cross-sectional views along the section plane A-A defined in FIG. 1A. In FIG. 1F, a piezoelectric plate 110 is attached to a substrate 120. A cavity 140, which does not fully penetrate the substrate 120, is formed in the substrate under the portion of the piezoelectric plate 110 containing the IDT of an XBAR. The cavity 140 may be formed, for example, by etching the substrate 120 before attaching the piezoelectric plate 110. Alternatively, the cavity 140 may be formed by etching the substrate 120 with a selective etchant that reaches the substrate through one or more openings provided in the piezoelectric plate 110.

In FIG. 1G, the substrate 120 includes a base 126 and an intermediate layer 128 disposed between the piezoelectric plate 110 and the base 126. For example, the base 126 may be silicon and the intermediate layer 128 may be silicon dioxide or silicon nitride or some other material. A cavity 140 is formed in the intermediate layer 128 under the portion of the piezoelectric plate 110 containing an XBAR. The cavity 140 may be formed, for example, by etching the intermediate layer 128 before attaching the piezoelectric plate 110. Alternatively, the cavity 140 may be formed by etching the intermediate layer 128 with a selective etchant that reaches the substrate through one or more openings (not shown) provided in the piezoelectric plate 110. In this case, the diaphragm 115 may be contiguous with the rest of the piezoelectric plate 110 around a large portion of a perimeter of the cavity 140. For example, the diaphragm 115 may be contiguous with the rest of the piezoelectric plate 110 around at least 50% of the perimeter of the cavity 140.

Figure 1H:
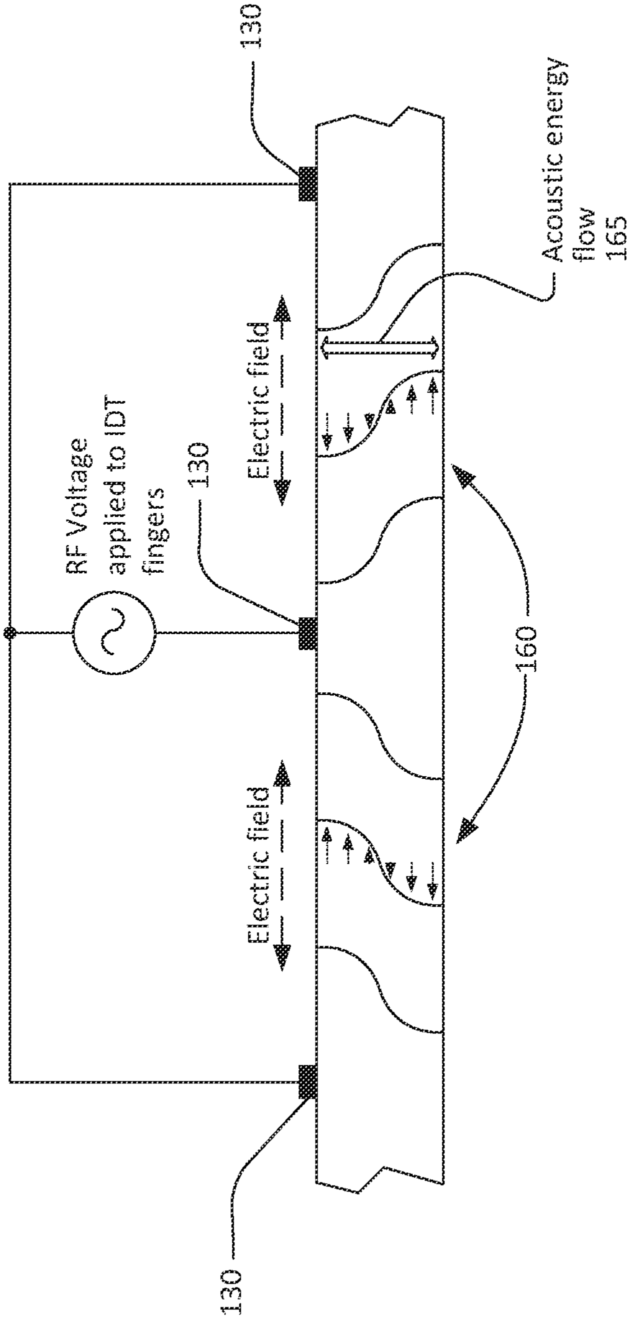
FIG. 1H is a graphic illustrating a shear horizontal acoustic mode in an XBAR according to an exemplary aspect.

FIG. 1H is a graphical illustration of the primary acoustic mode of interest in an XBAR. FIG. 1H shows a small portion of an XBAR 100 including a piezoelectric plate 110 and three interleaved IDT fingers of the IDT 130. An RF voltage is applied to the interleaved fingers. This voltage creates a time-varying electric field between the fingers. The direction of the electric field is lateral, or parallel to the surface of the piezoelectric plate 110, as indicated by the arrows labeled "electric field". Due to the high dielectric constant of the piezoelectric plate, the electric field is highly concentrated in the plate relative to the air. The lateral electric field introduces shear deformation, and thus strongly excites a shear-mode acoustic mode, in the piezoelectric plate 110. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 100 are represented by the curves 160, with the adjacent small arrows providing a schematic indication of the direction and magnitude of atomic motion. The degree of atomic motion, as well as the thickness of the piezoelectric plate 110, have been greatly exaggerated for ease of visualization. While the atomic motions are predominantly lateral (i.e. horizontal as shown in FIG. 1H), the direction of acoustic energy flow of the excited primary shear acoustic mode is substantially orthogonal to the surface of the piezoelectric plate, as indicated by the arrow 165.

Considering FIG. 1H, there is essentially no electric field immediately under the IDT fingers, and thus acoustic modes are only minimally excited in the regions under the fingers. There may be evanescent acoustic motions in these regions. Since acoustic vibrations are not excited under the IDT fingers, the acoustic energy coupled to the IDT fingers is low (for example compared to the fingers of an IDT in a SAW resonator), which minimizes viscous losses in the IDT fingers.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. Thus, high piezoelectric coupling enables the design and implementation of microwave and millimeter-wave filters with appreciable bandwidth.

Figure 2B:
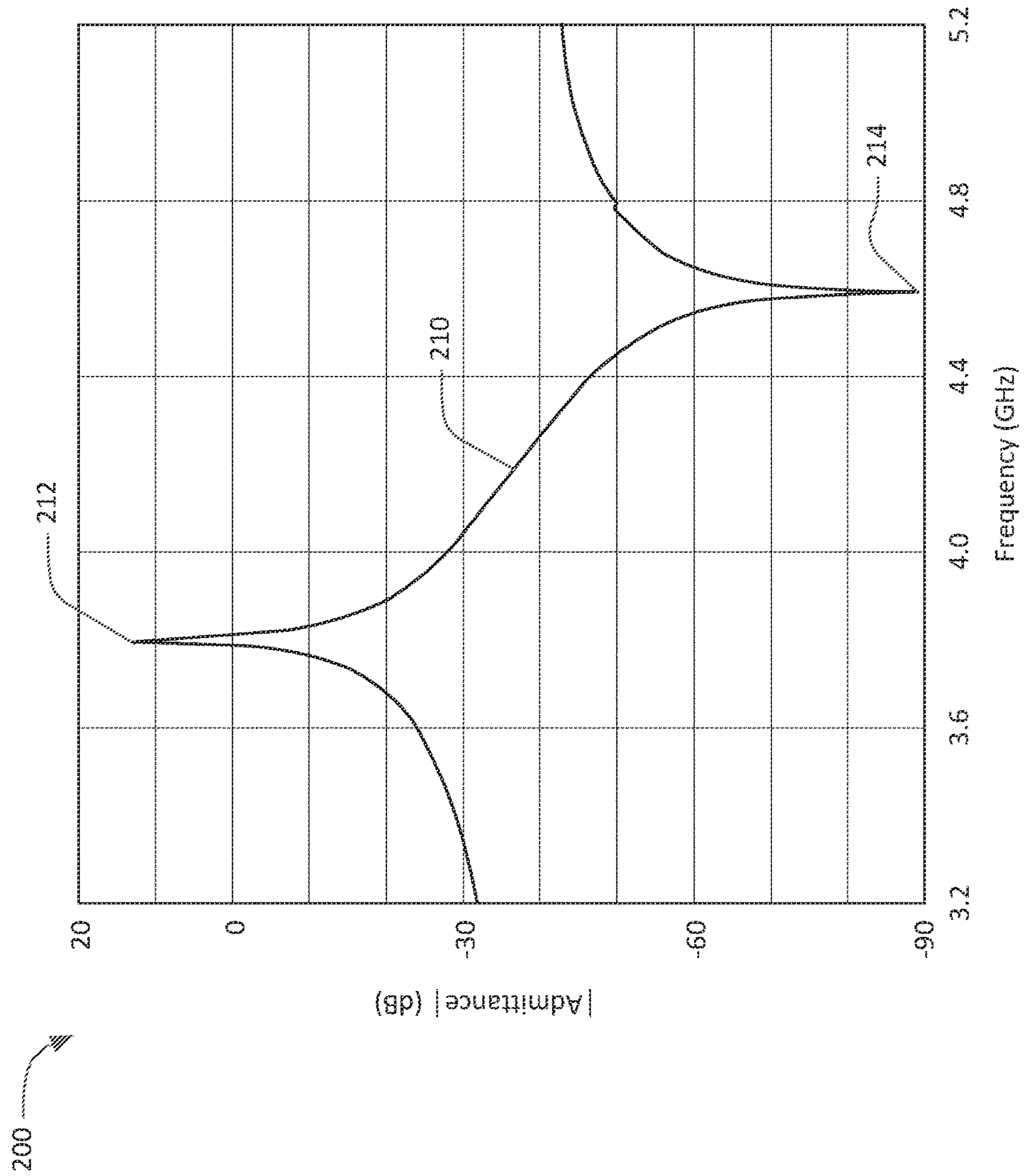
FIG. 2B is a graph of the magnitude of admittance of an ideal acoustic resonator.
Figure 2A:
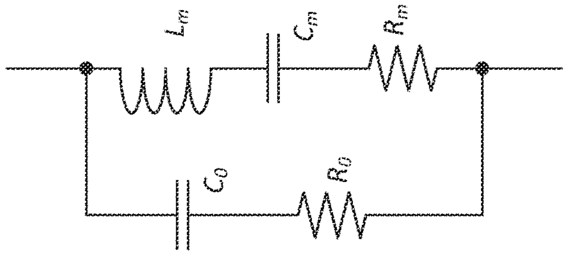
FIG. 2A is an equivalent circuit model of an acoustic resonator.

The basic behavior of acoustic resonators, including XBARs, is commonly described using the Butterworth Van Dyke (BVD) circuit model as shown in FIG. 2A. The BVD circuit model consists of a motional arm and a static arm. The motional arm includes a motional inductance $L_m$, a motional capacitance $C_m$, and a resistance $R_m$. The static arm includes a static capacitance $C_0$ and a resistance $R_0$. While the BVD model does not fully describe the behavior of an acoustic resonator, it does a good job of modeling the two primary resonances that are used to design band-pass filters, duplexers, and multiplexers (multiplexers are filters with more than 2 input or output ports with multiple passbands).

The first primary resonance of the BVD model is the motional resonance caused by the series combination of the motional inductance $L_m$ and the motional capacitance $C_m$. The second primary resonance of the BVD model is the anti-resonance caused by the combination of the motional inductance $L_m$, the motional capacitance $C_m$, and the static capacitance $C_0$. In a lossless resonator ($R_m=R_0=0$), the frequency Fr of the motional resonance is given by $$F_r = \frac{1}{2\pi\sqrt{L_m C_m}} \tag{1}$$

The frequency $F_a$ of the anti-resonance is given by $$F_a = F_r\sqrt{1+\frac{1}{\gamma}} \tag{2}$$

where $\gamma=C_0/C_m$ is dependent on the resonator structure and the type and the orientation of the crystalline axes of the piezoelectric material.

FIG. 2B is a graph 200 of the performance of a theoretical lossless acoustic resonator. Specifically, the solid curve 210 is a plot of the magnitude of admittance of the acoustic resonator as a function of frequency. The acoustic resonator has a resonance 212 at a resonance frequency where the admittance of the resonator approaches infinity. The resonance is due to the series combination of the motional inductance $L_m$ and the motional capacitance $C_m$ in the BVD model of FIG. 2A. The acoustic resonator also exhibits an anti-resonance 214 where the admittance of the resonator approaches zero. The anti-resonance is caused by the combination of the motional inductance $L_m$, the motional capacitance $C_m$, and the static capacitance $C_0$.

In simplified terms, the lossless acoustic resonator can be considered a short circuit at the resonance frequency 212 and an open circuit at the anti-resonance frequency 214. The resonance and anti-resonance frequencies in FIG. 2B are representative, and an acoustic resonator may be designed for other frequencies.

Figure 3:
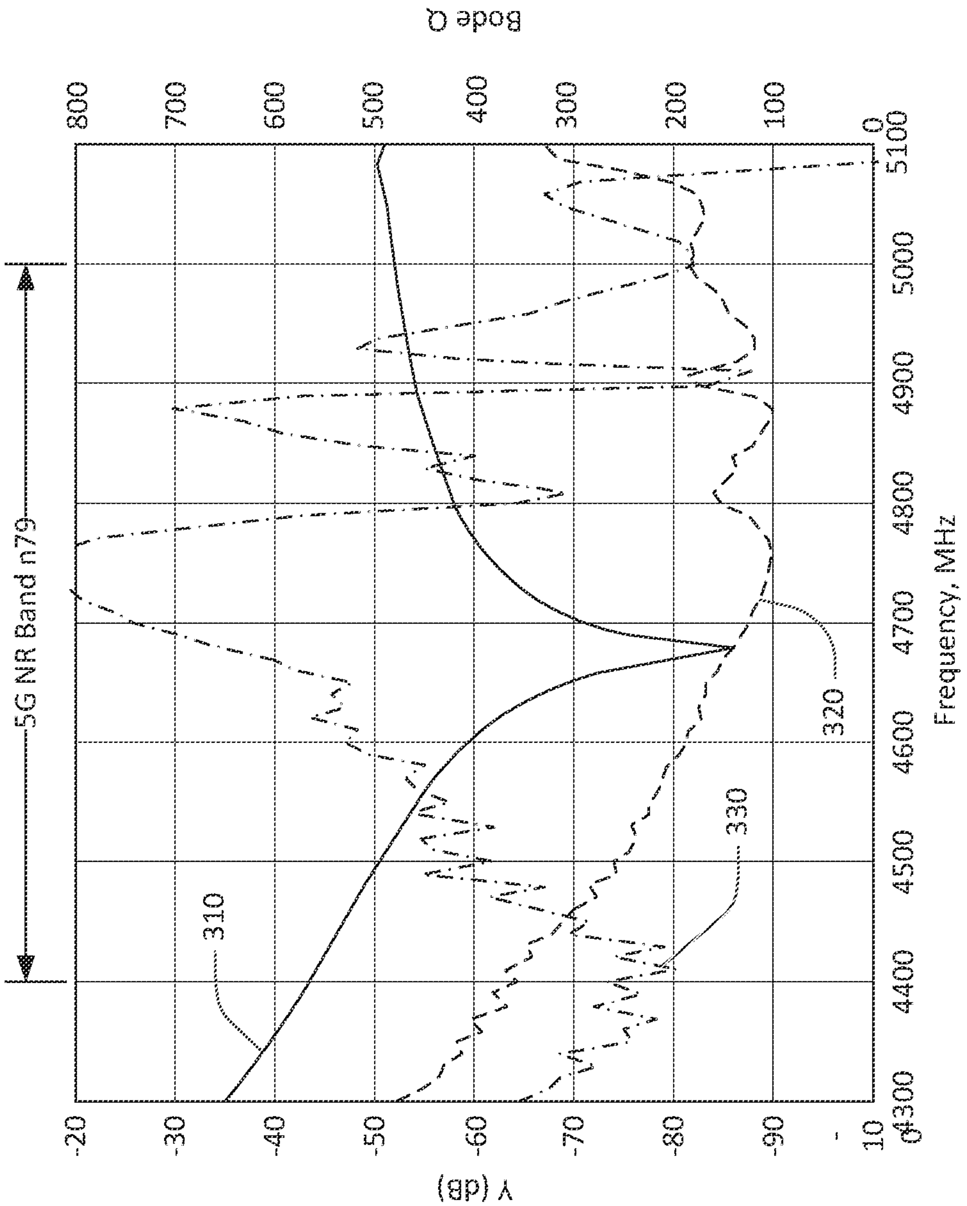
FIG. 3 is a graph of the admittance and Bode Q of a representative XBAR as functions of frequency.

FIG. 3 shows a graph 300 showing the performance of an example XBAR. The data for FIG. 3 and all subsequent graphs results from simulation of example XBAR devices using a finite element three-dimensional simulation technique.

Specifically, the solid curve 310 is a plot of the magnitude of admittance of the example XBAR as a function of frequency. The dashed line 320 is a plot of the real component of admittance for the XBAR. The curves 310 and 320 are read using the left-hand vertical axis. The example XBAR includes a Z-cut lithium niobate piezoelectric plate with a thickness of 0.368 um. The IDT pitch is 4.4 um, and the IDT finger mark is 0.96 um. The IDT mark/pitch ratio is 0.22. The IDT is predominantly aluminum with a total thickness of 0.491 um. The gap between the ends of the IDT fingers and the adjacent busbar is 5.0 μm. The XBAR has a resonance frequency about 4250 MHz (not shown) and an anti-resonance frequency about 4680 MHz. The example XBAR may be, for example, a shunt resonator for a band n79 bandpass filter. The frequency range of the graph 300 spans the n79 band from 4400 MHz to 5000 MHz which includes the admittance minimum at the anti-resonance of the XBAR.

The dot-dash curve 330 is a plot of the Bode Q-factor for the XBAR. Bode Q-factor is a measure of the efficiency of a resonator and is equal to a times the peak energy stored during a cycle of the input signal divided by the total energy dissipated during the cycle. The curve 330 is read against the right-hand vertical axis.

Figure 4:
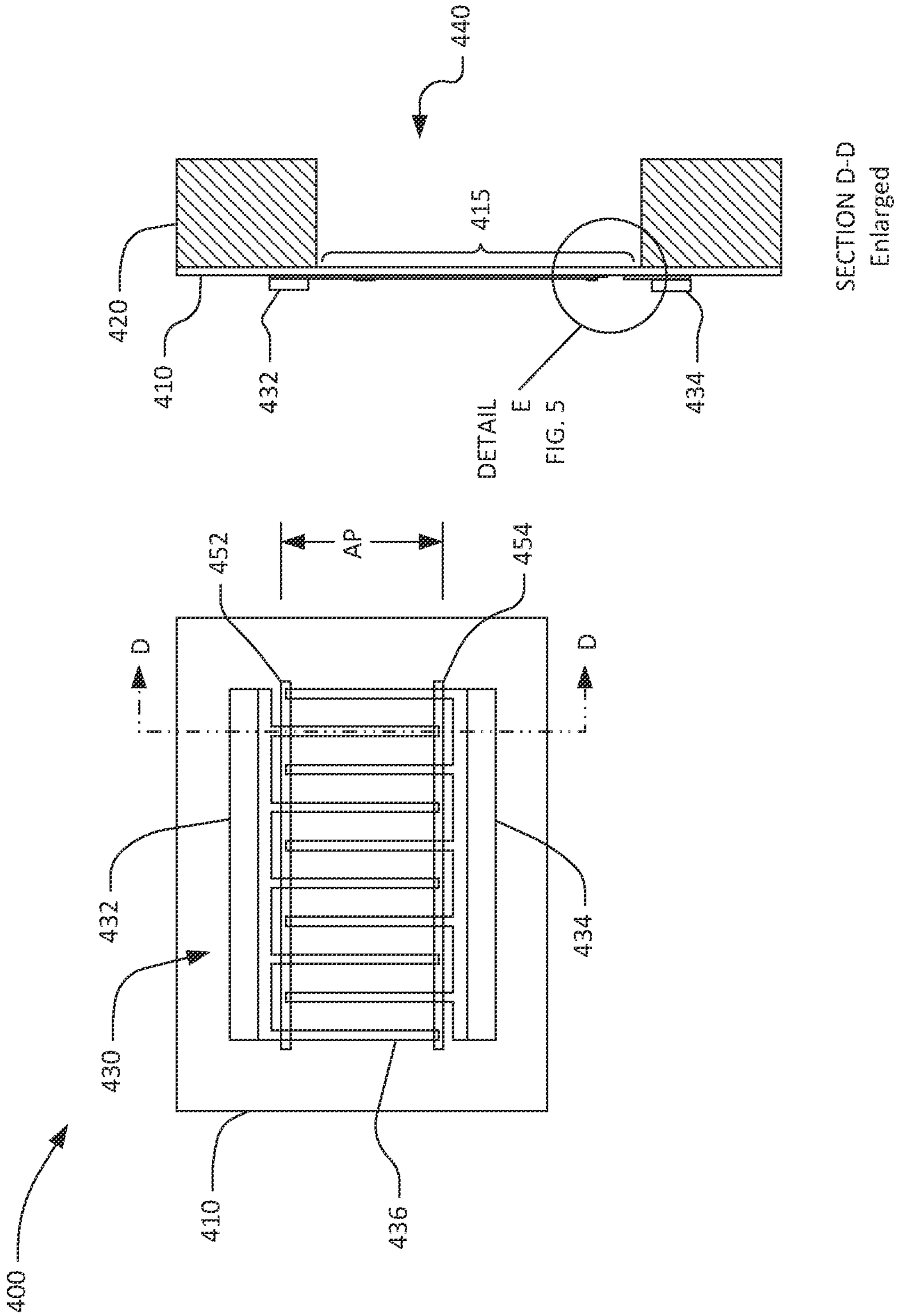
FIG. 4 includes a schematic plan view and an enlarged schematic cross-sectional view of an XBAR with a wide oxide strip structure.

FIG. 4 shows a simplified schematic top view and enlarged cross-sectional view of a transversely-excited film bulk acoustic resonator (XBAR) 400. The XBAR 400 is generally similarly to the XBAR 100 of FIG. 1A with the addition of a first dielectric strip 452 and a second dielectric strip 454.

The XBAR 400 includes a thin film conductor pattern formed on a surface of a piezoelectric plate 410. The piezoelectric plate 410 may be a thin plate of a single-crystal piezoelectric material. The material and the crystal orientation of the piezoelectric plate 410 may be as previously described with respect to piezoelectric plate 110 as described above with respect to FIG. 1A.

A back surface of the piezoelectric plate 410 is attached to a surface of a substrate 420 except for a portion of the piezoelectric plate 410 that forms a diaphragm 415 spanning a cavity 440 formed in the substrate. The substrate 420 may be, for example, silicon, sapphire, quartz, or some other material or combination of materials. The piezoelectric plate 410 and the substrate 420 may be bonded or attached as previously described.

The conductor pattern of the XBAR 400 includes an interdigital transducer (IDT) 430. The IDT 430 includes a first plurality of parallel fingers, such as finger 436, extending from a first busbar 432 and a second plurality of fingers extending from a second busbar 434. The first and second pluralities of parallel fingers are interleaved. The interleaved fingers overlap for a distance AP, commonly referred to as the "aperture" of the IDT. The direction parallel to the IDT fingers will be referred to herein as the "aperture direction". The center-to-center distance L between the outermost fingers of the IDT 430 is the "length" of the IDT. The direction perpendicular to the IDT fingers will be referred to herein as the "length direction." The IDT 430 is positioned on the piezoelectric plate 410 such that at least the fingers of the IDT 430 are disposed on the diaphragm 415. The materials of the conductor pattern may be as previously described.

Each dielectric strip 452, 454 is a strip of dielectric material that overlaps the IDT fingers at the margins of the aperture and extends into the gap between the ends of the IDT fingers and the adjacent busbars. In this context, the term "margin" means "the extreme edge of something and the area lying parallel to and immediately adjoining this edge especially when in some way distinguished from the remaining area lying farther in." In this case, the margins of the aperture are distinguished by the presence of the dielectric strips overlapping the IDT fingers.

The first dielectric strip 452, which is proximate to the first busbar 432, overlaps the IDT fingers in a first margin of the aperture. The first dielectric strip 452 extends into the gap between the first busbar 432 and ends of the IDT fingers extending from the second busbar 434. The second dielectric strip 454 overlaps the IDT fingers in a second margin of the aperture. The second dielectric strip 454 extends into the gap between the second busbar 434 and ends of the IDT fingers extending from the first busbar 432.

The first and second dielectric strips 452, 454 extend the entire length of the IDT 430, which is to say the dielectric strips overlap the ends of all the fingers of the IDT. The dielectric strips 452, 454 may extend beyond the length of the IDT 430 as shown in FIG. 4. In exemplary aspects, the dielectric strips may be silicon dioxide, silicon nitride, aluminum oxide, titanium dioxide, titanium nitride, diamond, or some other dielectric material. In all of the subsequent examples, the dielectric strips are silicon dioxide.

Figure 5:
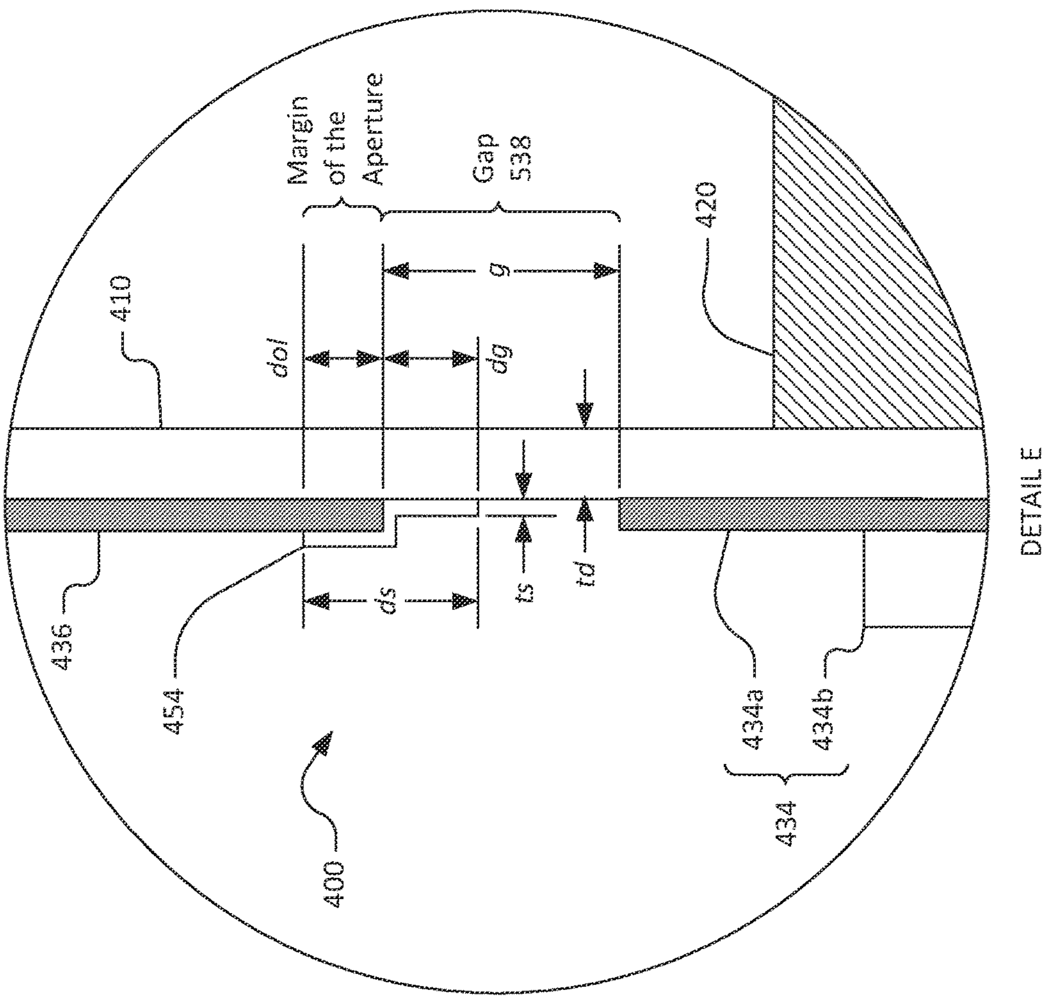
FIG. 5 is a detailed cross-sectional view of the wide oxide strip structure of FIG. 4.

FIG. 5 is a detailed cross-sectional view of a portion of XBAR 400 identified as "Detail E" in FIG. 4. FIG. 5 shows portions of the piezoelectric plate 410 and the substrate 420. An IDT finger 436 and a portion 434*a* of the second busbar 434 are formed in a first conductor level. The second busbar 434 typically includes a second conductor level 434*b*. The gap 538 between the end of the IDT finger 436 and the portion of the busbar 434*a* has a width g. The term "width" means a dimension in the aperture direction (measured parallel to the long direction of the IDT fingers).

The dielectric strip 454 has a total width of ds, of which a first portion with a width dol overlaps the IDT finger 436 in the margin of the aperture, and a second portion with a width dg is disposed on the diaphragm 410 in the gap 538. dg is less than g such that the second portion of the dielectric strip 454 does not span the gap 538. The thickness ts of the dielectric strip 454 may be between 4 nm and 30 nm. The thickness td of the piezoelectric plate 410 may be between 100 nm and 1000 nm. In some aspects, the thickness ts of the dielectric strip 454 and the thickness td of the piezoelectric plate 410 are related by $0.008td \leq ts \leq 0.06td$. In some aspects, the width dol of the first portion has the following relationship to the thickness td of the piezoelectric plate 410: $0.6td \leq dol \leq 3.0td$. In some aspects, the width ds of the dielectric strip and the thickness td of the piezoelectric plate 410 are related by $4.0td \leq ds \leq 15.0td$. The effect of the thickness of the dielectric strip 454, in combination with dummy finger structures, will be discussed below.

Figure 6:
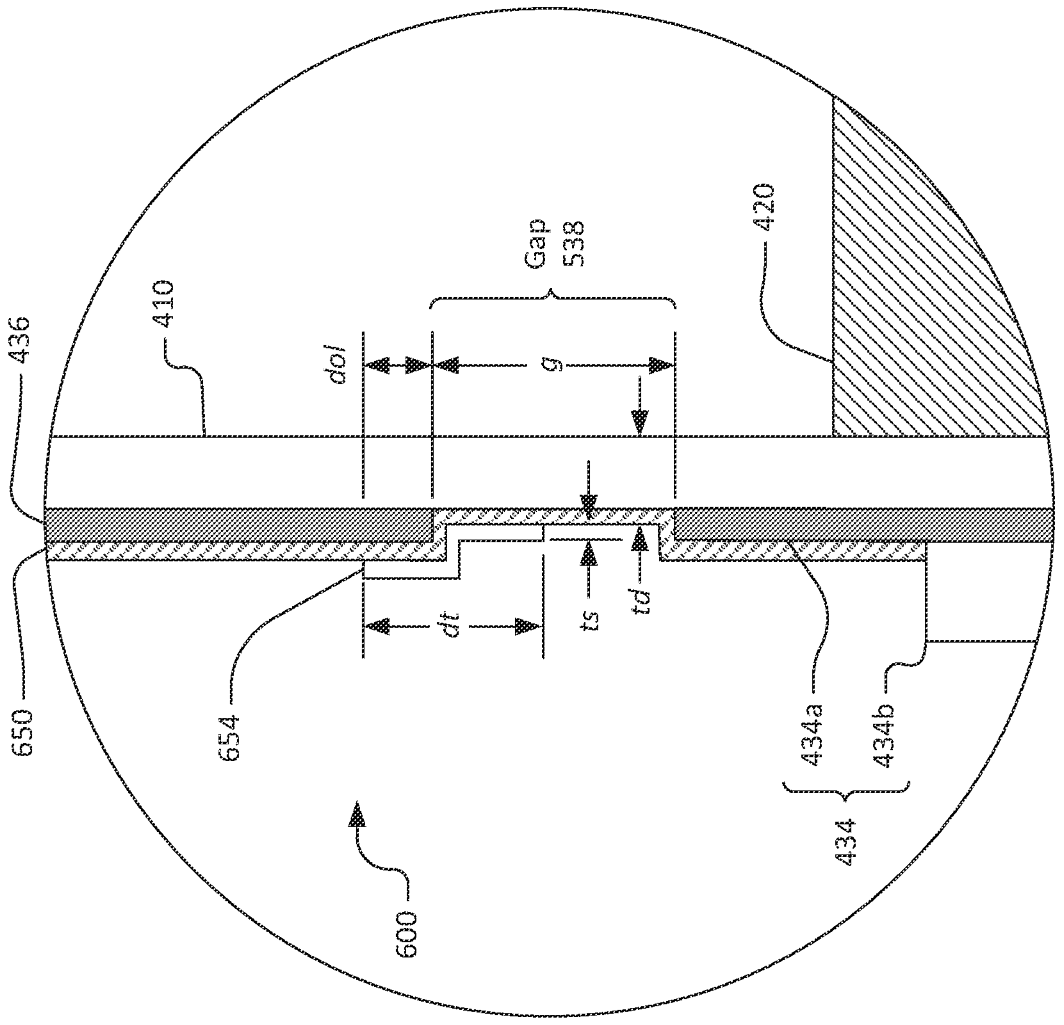
FIG. 6 is a detailed cross-sectional view of another wide oxide strip structure.

FIG. 6 is a detailed cross-sectional view of a portion of another XBAR 600. The XBAR 600 is similar to the XBAR 400 shown in FIG. 5 with the addition of a dielectric layer 650 over the surface of the diaphragm 410 extending in the length direction between the IDT finger 436. Layer 650 may also extend in the aperture direction along the sides of the IDT fingers from the busbar to dielectric strip 654; and vertically the layer 650 may be positioned between the plate 410 and the dielectric strip 654, in some embodiments. However, in some embodiments, the dielectric strip 654 may be positioned between the plate 410 and the layer 650. All of the other elements and dimensions of the XBAR 600 are the same as the corresponding elements of the XBAR 400.

In the example of FIG. 6, the dielectric strip 654 is over the dielectric layer 650 (i.e., farther from the piezoelectric plate 410), which indicates that the dielectric strip 654 was formed after the dielectric layer 650. The converse, with the dielectric layer 650 over the dielectric strip 654, is also possible. In some embodiments, a first dielectric layer 650 may be under the dielectric strip 654 and a second dielectric layer (not shown) may be over the dielectric strip 654. For example, the first dielectric layer may be a frequency-setting layer and the second dielectric layer may be a passivation layer to seal the conductor pattern and other surfaces of the XBAR 600.

Figure 7:
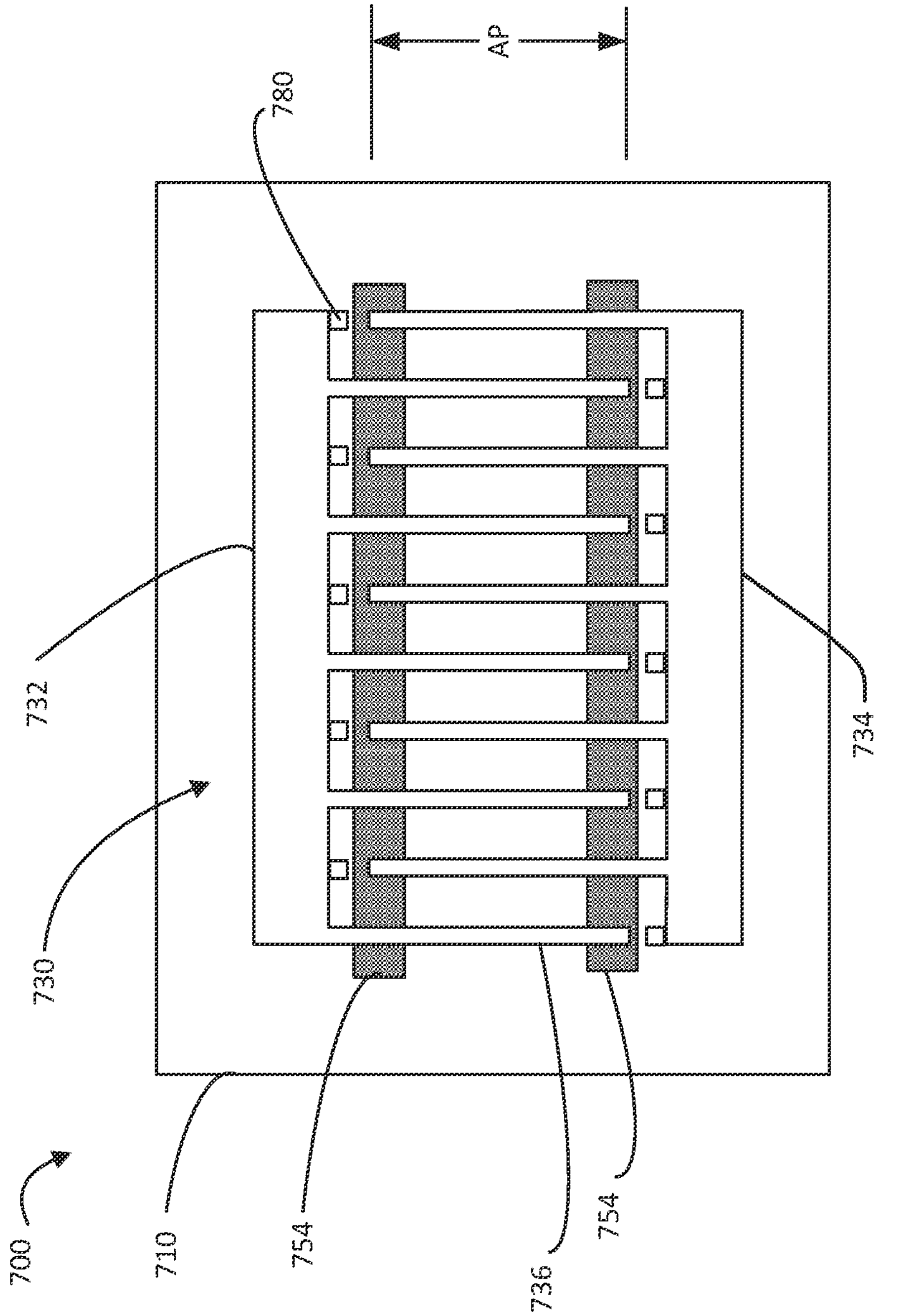
FIG. 7 is a schematic plan view of an XBAR with dummy fingers.

FIG. 7 is a schematic plan view of an XBAR 700, which has substantially the same structure as XBAR 600, with the addition of dummy finger structures to reduce acoustic energy leakage. Similar to the above-described XBARs, XBAR 700 includes a piezoelectric plate 710, and an IDT 730 having interleaved fingers 736 extending from busbars 732, 734 on the piezoelectric plate 710. The interleaved fingers overlap for a distance AP, referred to as the "aperture" of the IDT. Further, one or a plurality of dummy fingers 780 extend alternately from the busbars 732, 734 into a gap between the dielectric strip 754 and the busbar 732, 734. For example, the distance between the ends, such as the tips, of the dummy fingers 780 and the dielectric strip 754 may be between 0 and 3 μm in an exemplary aspect. In performance simulations, distances of 1 μm and 1.5 μm between the dummy fingers and the dielectric strip provided the best spur suppression.

The dummy fingers 780 can be metal (e.g., the same or different metal as the IDT fingers) and/or one or more other materials such as $SiO_2$ or other dielectrics. The dummy fingers 780 can have various shapes, such as a hammerhead shape with a thicker portion away from the busbar and a thinner portion near the busbar. The width of the dummy fingers 780 may be between 75% and 125% of the width of the IDT fingers. Various width and length structures for the dummy fingers 780 will be described below.

Figure 8:
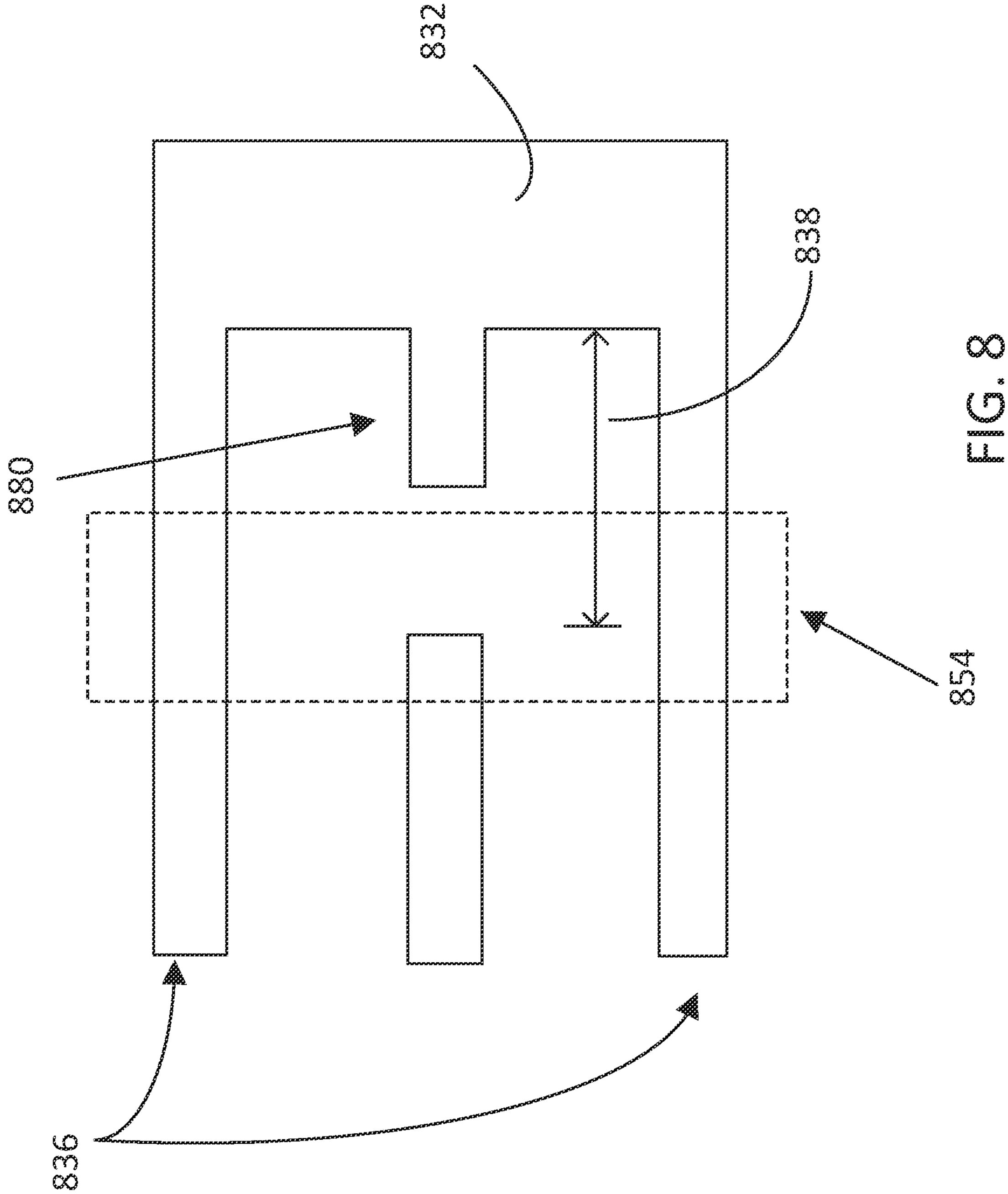
FIG. 8 is a detailed schematic view of a single dummy finger in the XBAR of FIG. 7.

FIG. 8 is a detailed view of a portion of XBAR 700 showing a single dummy finger 880 positioned between two neighboring IDT fingers 836. The single dummy finger 880 can represent each of the dummy fingers 780 described above with respect to FIG. 7. Moreover, the IDT fingers 836 and the dummy finger 880 all extend from the same busbar 832. For example, the IDT fingers 836 and the dummy finger 880 can be formed of a single material with the busbar 832 Also shown is a dielectric strip 854 covering a margin of the aperture of the IDT, as well as a portion of the gap 838 between the busbar 832 and the finger extending from the opposite busbar.

In the example of FIG. 8, the dummy finger 880 extends from the busbar 832 toward the dielectric strip 854 but terminates in the gap 838 without reaching the dielectric strip 854. The dielectric strip 854 is an acoustic confinement structure that improves Bode Q of the XBAR between its resonance and anti-resonance frequencies. Addition of the dummy fingers 880 extend this benefit of the dielectric strip 854 by reducing losses near the anti-resonance frequency.

Figure 9:
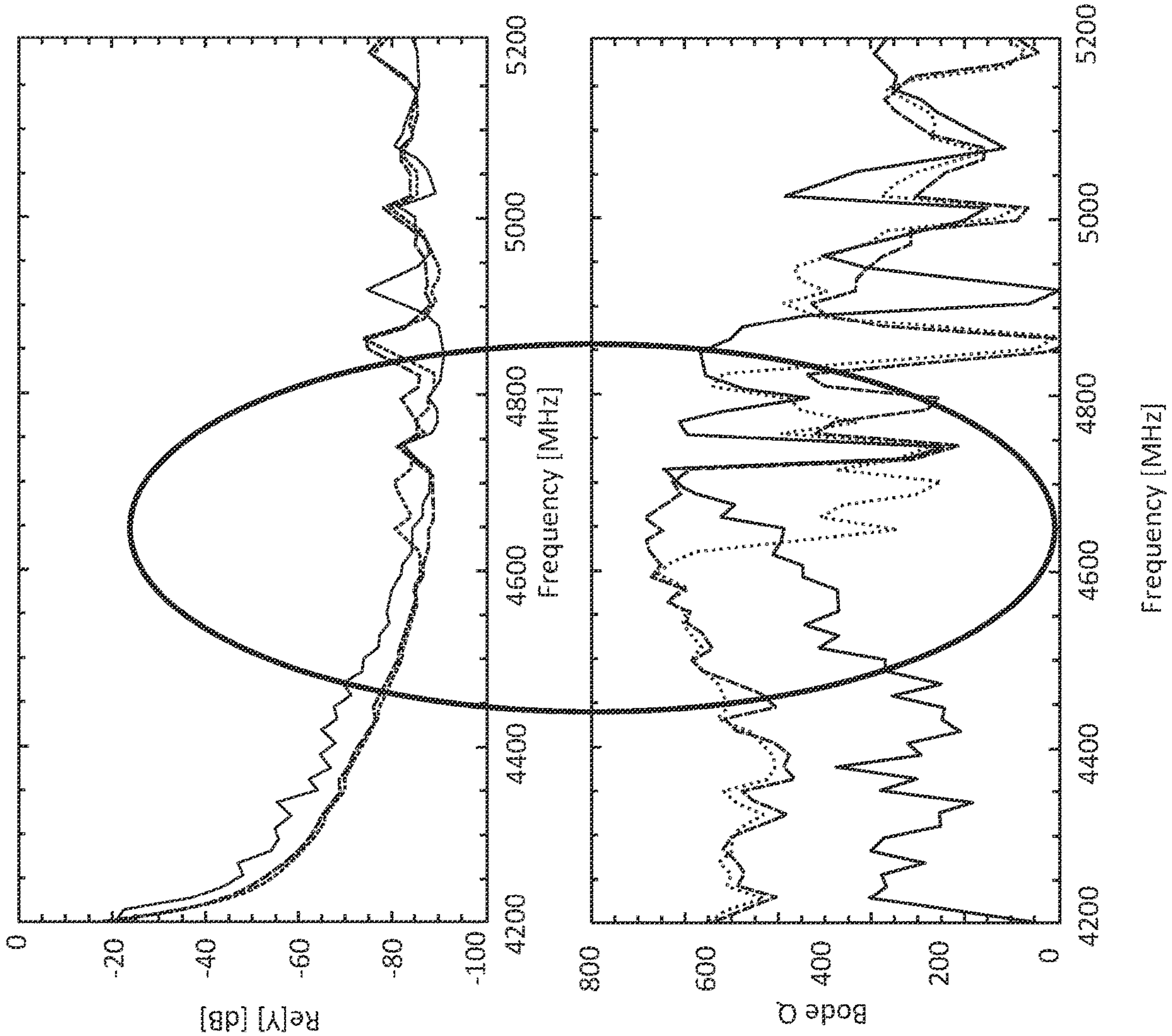
FIG. 9 is a graphs of the admittance and Bode Q as functions of frequency for an XBAR with wide oxide strip and dummy finger structures.
Figure 10:
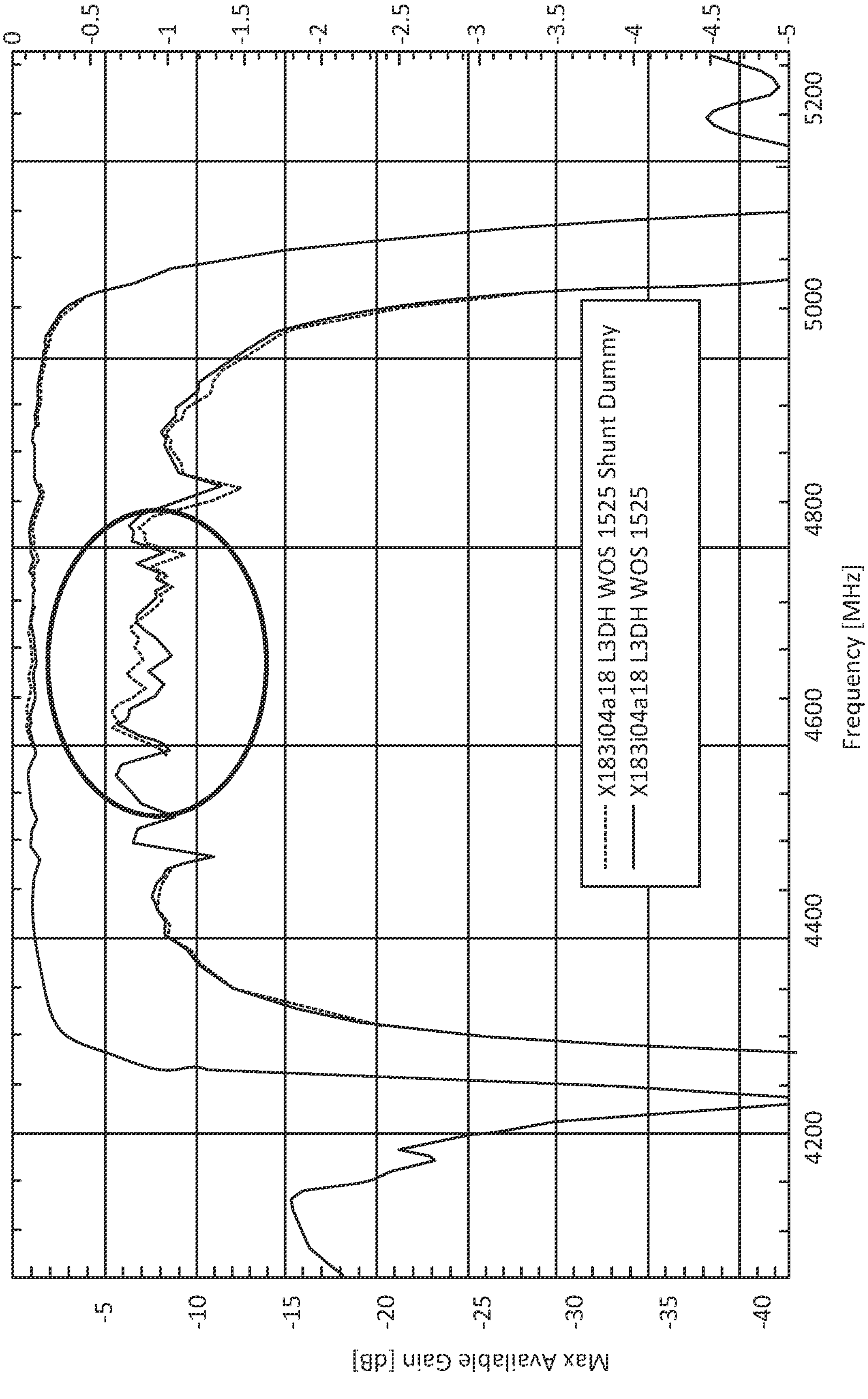
FIG. 10 is a graph of the maximum available gain as a function of frequency for an XBAR with wide oxide strip and dummy finger structures.

FIGS. 9 and 10 show graphs indicating the combined benefits of the dielectric strip 854 and dummy fingers 880. FIG. 9 includes two graphs showing the improved performance of an XBAR structure with both a dielectric strip and dummy fingers. The top graph of FIG. 9 plots admittance against frequency, while the bottom graph of FIG. 9 plots Bode Q against frequency.

The three curves in each of the two graphs of FIG. 9 represent, respectively, an XBAR structure with a dielectric strip, but no dummy fingers (dotted curve), an XBAR structure with both a dielectric strip and dummy fingers (dashed curve), and an XBAR structure having dummy fingers but no dielectric strip (solid curve). The circled portions in both the top and bottom graphs correlate roughly to the area between the resonance and anti-resonance frequencies of the XBAR structures.

The circled portions in the graphs of FIG. 9 indicate that, in the area between the resonance and anti-resonance of the tested XBAR structures, both admittance and Bode Q were improved in the structure with both the dielectric strip and the dummy fingers. Specifically, as noted above, the XBAR structure including both the dummy fingers and the dielectric strip is shown to reduce losses and improve performance near the anti-resonance frequency.

FIG. 10 is a graph illustrating the benefit of combining the dielectric strip with the dummy fingers. The graph plots maximum available gain against frequency of bandpass filters including two different XBAR structures. Specifically, the curves in FIG. 10 indicate the maximum available gain of a bandpass filter including an XBAR structure with a dielectric strip but no dummy fingers (solid curve) and the maximum available gain of a bandpass filter including an XBAR structure with both a dielectric strip and dummy fingers (dotted curve).

As shown in FIG. 10, the maximum available gain for both filters is substantially similar across most of the tested frequencies. However, in the circled central frequency region, the maximum available gain of the bandpass filter including an XBAR structure with both the dielectric strip and the dummy fingers is higher than the maximum available gain of the bandpass filter including an XBAR structure including only the dielectric strip. Thus, FIG. 10 shows a lowered insertion loss at the central frequencies of filters that use an XBAR structure having both the dielectric strip and the dummy fingers. This lowered insertion loss is the result of the improved admittance and Bode Q of the XBAR structure having both the dielectric strip and the dummy fingers, as shown in the graphs of FIG. 9.

While FIGS. 9 and 10 show the performance improvements achieved by the combination of the dielectric strip and the dummy fingers, the extent of such performance improvements is dependent on the specific structure of the dummy fingers. For example, FIG. 11 shows eight possible dummy finger configurations, as well as the configurations of the IDT fingers neighboring the dummy fingers.

Figure 11:
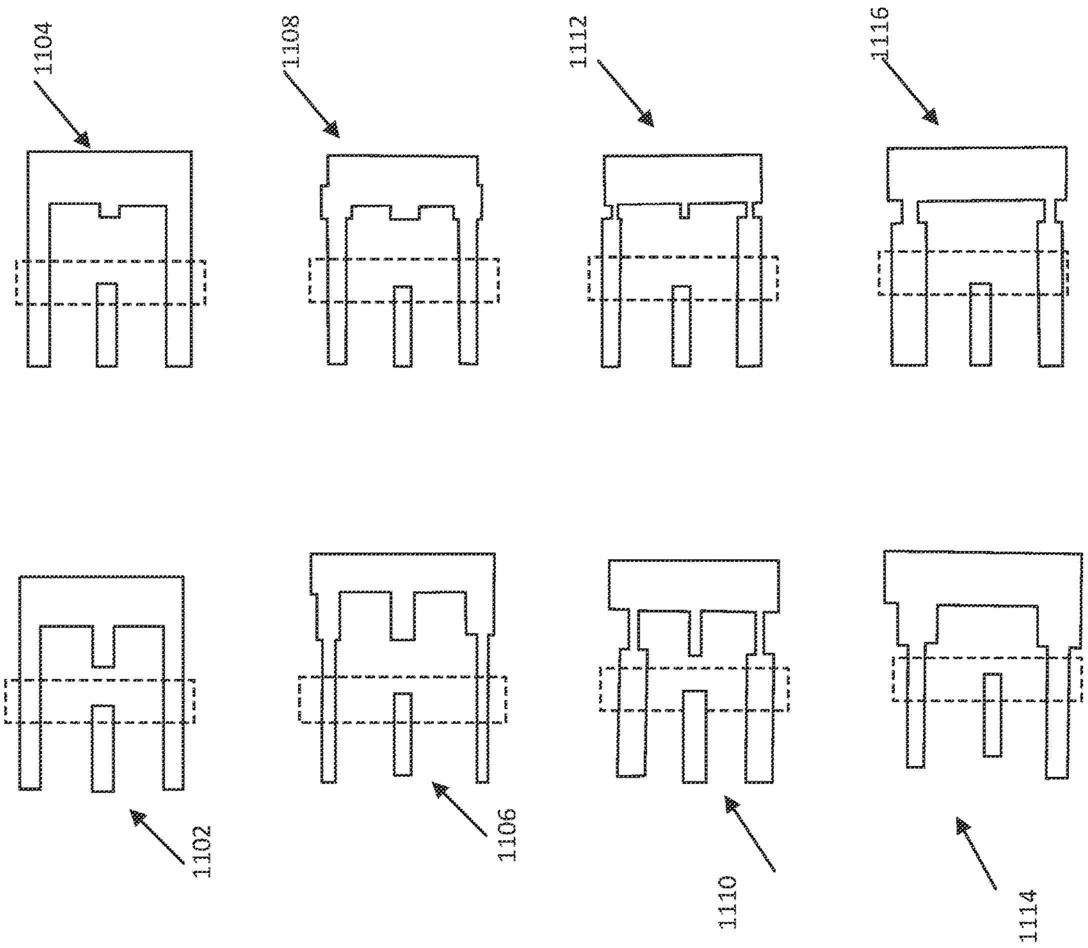
FIG. 11 shows dummy finger structure variations.

Each of the described dummy finger configurations 1102, 1104, 1106, 1108, 1110, 1112, 1114, and 1116 shown in FIG. 11 is assessed with respect to Bode Q to determine the effect, if any, of changes in width and length of the dummy finger on performance. Configuration 1102 is similar in structure to the XBAR configuration shown in FIG. 8. That is, the dummy finger has the same width (mark) as the IDT fingers and extends halfway into the gap (indicated as 838 in FIG. 8) between the busbar and the opposing IDT finger.

Configuration 1104 includes a dummy finger that has the same width (mark) as the IDT fingers, but extends only one quarter of the way into the gap between the busbar and the opposing IDT finger. Configuration 1106 includes a dummy finger that is 1.25 times the width of the IDT fingers and extends halfway into the gap between the busbar and the opposing IDT finger. In configuration 1106, the electrodes connecting the IDT fingers neighboring the dummy finger to the busbar are also 1.25 times the width of the IDT fingers. This wider electrode of the neighboring IDT fingers extends for the same length as the dummy finger (i.e., a length equivalent to half of the gap between the busbar and the opposing IDT finger). Beyond the wider electrode, the neighboring IDT fingers in configuration 1106 are the same width as the other IDT fingers.

Configuration 1108 includes a dummy finger that is 1.25 times the width of the regular IDT finger but extends only a quarter of the way into the gap (25% the length of the gap) between the busbar and the opposing IDT finger. As in configuration 1106, the electrodes of neighboring IDT fingers of configuration 1108 have the same width as the dummy finger (i.e., are wider than the IDT fingers).

Configuration 1110 includes a dummy finger that is 0.75 times the width of the regular IDT finger width and extends halfway into the gap between the busbar and the opposing IDT finger. In this configuration, the electrodes of the neighboring IDT finger are also 0.75 times the width of the regular IDT finger width. That is, the electrodes of the neighboring IDT fingers, which are directly across from the dummy finger, are thinner than the neighboring IDT fingers.

Configuration 1112 includes a dummy finger that is 0.75 times the width of the regular IDT finger width and extends a quarter of the way into the gap between the busbar and the opposing IDT finger. In configuration 1112, the thinner electrodes of the neighboring IDT fingers are shorter than the thinner electrodes in configuration 1110, to match the shorter length of the dummy finger in configuration 1112 as compared to the dummy finger in configuration 1110.

Configurations 1114 and 1116 do not include a dummy finger but instead have wider and thinner electrodes of the IDT fingers, respectively. The wider and thinner electrodes of respective configurations 1114 and 1116 have a length equivalent to half of the gap between the busbar and the opposing IDT finger. That is, configuration 1114 has IDT fingers with the wider electrodes similar to configuration 1106 without the dummy finger and configuration 1116 has IDT fingers with thinner electrodes similar to configuration 1110 without the dummy finger.

As described above, performance of configurations 1102, 1104, 1106, 1108, 1110, 1112, 1114, and 1116 was assessed to determine whether and how dimensions of the dummy fingers and dimensions of electrodes of the IDT fingers affect Bode Q of the corresponding XBARs. Generally, the result of such assessment indicates that configurations 1102, 1106, and 1110 (which all have dummy fingers extending halfway into the gap) have a similar response, configurations 1104, 1108 and 1112 have a similar response (which all have dummy fingers extending a quarter of the way into the gap), and configurations 1114 and 1116 (both having no dummies, but the electrode width changes) have a similar response.

Accordingly, the performance assessment of the various configurations indicates that the electrode width of the IDT fingers does not affect performance. As far as dimensions of the dummy fingers, XBAR/filter performance appears most affected by dummy finger length. Results indicate that configurations 1114 and 1116 both have a spur and reduction in Bode Q near 5600 MHz. This spur is moved up in frequency somewhat in the configurations having the short dummy fingers (configurations 1104, 1108, and 1112), but the longer dummy finger configurations (1102, 1106, and 1110) did not generate the spur.

In the longer dummy finger configurations (1102, 1106, and 1110), there is a slight penalty in Bode Q between 5200 and 5500 MHz. If the dummy finger gets longer than halfway of the gap (not shown), the Bode Q penalty becomes larger. Accordingly, optimal dummy length will be determined by the acceptable spur amplitude/location requirements of the XBAR application.

Figure 12:
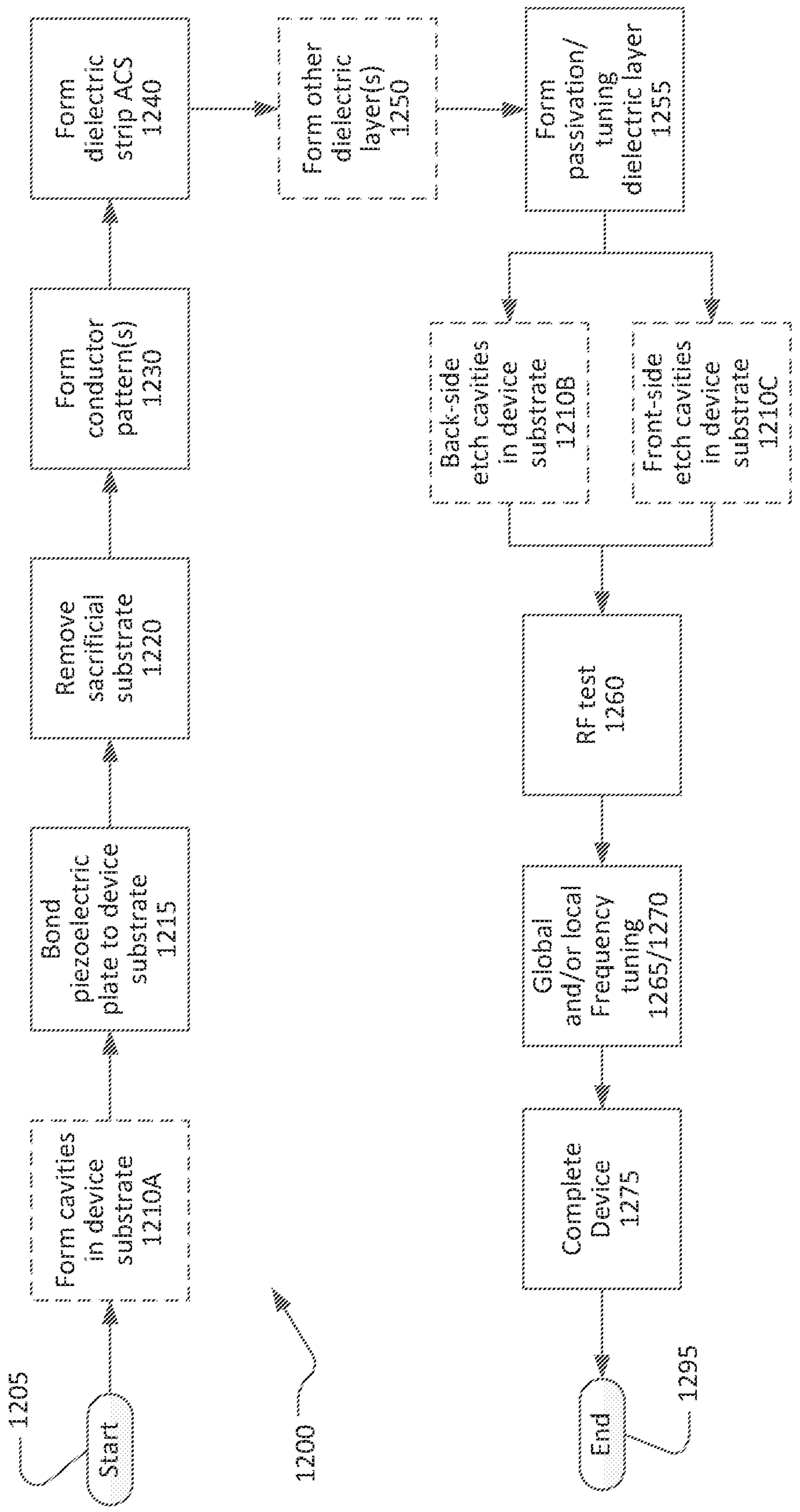
FIG. 12 is a flow chart of a method for fabricating an XBAR including wide oxide strip and dummy finger structures.

FIG. 12 is a simplified flow chart summarizing a process 1200 for fabricating a filter device incorporating XBARs with structures including one or more dielectric strips and dummy fingers for improving filter performance and reducing acoustic energy leakage. Specifically, the process 1200 is for fabricating a filter device including multiple XBARs, some of which may include a frequency setting dielectric or coating layer. The process 1200 starts at 1205 with a device substrate and a thin plate of piezoelectric material disposed on a sacrificial substrate. The process 1200 ends at 1295 with a completed filter device. The flow chart of FIG. 12 includes only major process steps. Various conventional process steps (e.g. surface preparation, cleaning, inspection, baking, annealing, monitoring, testing, etc.) may be performed before, between, after, and during the steps shown in FIG. 12.

While FIG. 12 generally describes a process for fabricating a single filter device, multiple filter devices may be fabricated simultaneously on a common wafer (including a piezoelectric plate bonded to a substrate). In this case, each step of the process 1200 may be performed concurrently on all of the filter devices on the wafer.

The flow chart of FIG. 12 captures three variations of the process 1200 for making an XBAR which differ in when and how cavities are formed in the device substrate. The cavities may be formed at steps 1210A, 1210B, or 1210C. Only one of these steps is performed in each of the three variations of the process 1200.

The piezoelectric plate may typically be Z-cut or 82Y-cut lithium niobate. The piezoelectric plate may be some other material and/or some other cut. The device substrate may preferably be silicon. The device substrate may be some other material that allows formation of deep cavities by etching or other processing.

In one variation of the process 1200, one or more cavities are formed in the device substrate at 1210A, before the piezoelectric plate is bonded to the substrate at 1215. A separate cavity may be formed for each resonator in a filter device. Also, the cavities can be shaped and formed such that two or more resonators can be on one diaphragm over one cavity. These resonators sharing a diaphragm are acoustically coupled on an acoustic track. The one or more cavities may be formed using conventional photolithographic and etching techniques. Typically, the cavities formed at 1210A will not penetrate through the device substrate.

At 1215, the piezoelectric plate is bonded to the device substrate. The piezoelectric plate and the device substrate may be bonded by a wafer bonding process. Typically, the mating surfaces of the device substrate and the piezoelectric plate are highly polished. One or more layers of intermediate materials, such as an oxide or metal, may be formed or deposited on the mating surface of one or both of the piezoelectric plate and the device substrate. One or both mating surfaces may be activated using, for example, a plasma process. The mating surfaces may then be pressed together with considerable force to establish molecular bonds between the piezoelectric plate and the device substrate or intermediate material layers.

At 1220, the sacrificial substrate may be removed. For example, the piezoelectric plate and the sacrificial substrate may be a wafer of piezoelectric material that has been ion implanted to create defects in the crystal structure along a plane that defines a boundary between what will become the piezoelectric plate and the sacrificial substrate. At 1220, the wafer may be split along the defect plane, for example by thermal shock, detaching the sacrificial substrate and leaving the piezoelectric plate bonded to the device substrate. The exposed surface of the piezoelectric plate may be polished or processed in some manner after the sacrificial substrate is detached.

A first conductor pattern, including IDTs and dummy fingers of each XBAR, is formed at 1230 by depositing and patterning one or more conductor layers on the front side of the piezoelectric plate. The conductor layer may be, for example, aluminum, an aluminum alloy, copper, a copper alloy, or some other conductive metal. In some aspects, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A second conductor pattern of gold, aluminum, copper or other higher conductivity metal may be formed over portions of the first conductor pattern (for example the IDT bus bars and interconnections between the IDTs).

Each conductor pattern may be formed at 1230 by depositing the conductor layer and, in some aspects, one or more other metal layers in sequence over the surface of the piezoelectric plate. The excess metal may then be removed by etching through patterned photoresist. The conductor layer can be etched, for example, by plasma etching, reactive ion etching, wet chemical etching, or other etching techniques.

Alternatively, each conductor pattern may be formed at 1230 using a lift-off process. Photoresist may be deposited over the piezoelectric plate and patterned to define the conductor pattern. The conductor layer and, in some aspects, one or more other layers may be deposited in sequence over the surface of the piezoelectric plate. The photoresist may then be removed, which removes the excess material, leaving the conductor pattern.

At 1240, one or more dielectric strips may be formed. As previously described, the dielectric strips may overlap the ends of the IDT fingers in the margins of the aperture and extend into the gaps between the ends of the IDT fingers and adjacent busbars. The dielectric strips may be formed by depositing and patterning, using either etching or a lift-off technique, a dielectric thin film. The dielectric strips may be silicon dioxide, silicon nitride, aluminum oxide, or some other dielectric material. The dielectric strips may be multiple layers of different materials or a mixture of two or more materials. Step 1240 may be repeated to form multiple dielectric strips overlapping the ends of the IDT fingers for multiple resonators where the dielectric strips in the two margins of one resonator have a different thickness than the thickness for the dielectric strips of another resonator.

At 1250, one or more frequency setting dielectric layer(s) may be formed in some aspects by depositing one or more layers of dielectric material on the front side of the piezoelectric plate. For example, a dielectric layer may be formed over shunt resonators to lower the frequencies of the shunt resonators relative to the frequencies of series resonators. The one or more dielectric layers may be deposited using a conventional deposition technique such as physical vapor deposition, atomic layer deposition, chemical vapor deposition, or some other method. One or more lithography processes (using photomasks) may be used to limit the deposition of the dielectric layers to selected areas of the piezoelectric plate. For example, a mask may be used to limit a dielectric layer to cover only the shunt resonators. The formation of one or more frequency setting layers at 1250 may be performed before or after (as shown) the formation of the dielectric strips at 1240.

At 1255, a passivation/tuning dielectric layer is deposited over the piezoelectric plate and conductor patterns. The passivation/tuning dielectric layer may cover the entire surface of the filter except for pads for electrical connections to circuitry external to the filter. In some instantiations of the process 1200, the passivation/tuning dielectric layer may be formed after the cavities in the device substrate are etched at either 1210B or 1210C.

In a second variation of the process 1200, one or more cavities are formed in the back side of the device substrate at 1210B. A separate cavity may be formed for each resonator in a filter device. Also, the cavities can be shaped and formed such that two or more resonators can be on one diaphragm over one cavity. These resonators sharing a diaphragm are acoustically coupled on an acoustic track. The one or more cavities may be formed using an anisotropic or orientation-dependent dry or wet etch to open holes through the back side of the device substrate to the piezoelectric plate. In this case, the resulting resonator devices will have a cross-section as shown in FIG. 1A.

In a third variation of the process 1200, one or more cavities in the form of recesses in the device substrate may be formed at 1210C by etching the substrate using an etchant introduced through openings in the piezoelectric plate. A separate cavity may be formed for each resonator in a filter device. Also, the cavities can be shaped and formed such that two or more resonators can be on one diaphragm over one cavity. These resonators sharing a diaphragm are acoustically coupled on an acoustic track. The one or more cavities formed at 1210C will not penetrate through the device substrate.

Ideally, after the cavities are formed at 1210B or 1210C, most or all of the filter devices on a wafer will meet a set of performance requirements. However, normal process tolerances will result in variations in parameters such as the thicknesses of dielectric layers formed at 1250 and 1255, variations in the thickness and line widths of conductors and IDT fingers formed at 1230, and variations in the thickness of the piezoelectric plate. These variations contribute to deviations of the filter device performance from the set of performance requirements.

To improve the yield of filter devices meeting the performance requirements, frequency tuning may be performed by selectively adjusting the thickness of the passivation/tuning layer deposited over the resonators at 1255. The frequency of a filter device passband can be lowered by adding material to the passivation/tuning layer, and the frequency of the filter device passband can be increased by removing material from the passivation/tuning layer. Typically, the process 1200 is biased to produce filter devices with passbands that are initially lower than a required frequency range but can be tuned to the desired frequency range by removing material from the surface of the passivation/tuning layer.

At 1260, a probe card or other means may be used to make electrical connections with the filter to allow radio frequency (RF) tests and measurements of filter characteristics such as input-output transfer function. Typically, RF measurements are made on all, or a large portion, of the filter devices fabricated simultaneously on a common piezoelectric plate and substrate.

At 1265, global frequency tuning may be performed by removing material from the surface of the passivation/tuning layer using a selective material removal tool such as, for example, a scanning ion mill as previously described. "Global" tuning is performed with a spatial resolution equal to or larger than an individual filter device. The objective of global tuning is to move the passband of each filter device towards a desired frequency range. The test results from 1260 may be processed to generate a global contour map indicating the amount of material to be removed as a function of two-dimensional position on the wafer. The material is then removed in accordance with the contour map using the selective material removal tool.

At 1270, local frequency tuning may be performed in addition to, or instead of, the global frequency tuning performed at 1265. "Local" frequency tuning is performed with a spatial resolution smaller than an individual filter device. The test results from 1260 may be processed to generate a map indicating the amount of material to be removed at each filter device. Local frequency tuning may require the use of a mask to restrict the size of the areas from which material is removed. For example, a first mask may be used to restrict tuning to only shunt resonators, and a second mask may be subsequently used to restrict tuning to only series resonators (or vice versa). This would allow independent tuning of the lower band edge (by tuning shunt resonators) and upper band edge (by tuning series resonators) of the filter devices.

After frequency tuning at 1265 and/or 1270, the filter device is completed at 1275. Actions that may occur at 1275 include forming bonding pads or solder bumps or other means for making connection between the device and external circuitry (if such pads were not formed at 1230); excising individual filter devices from a wafer containing multiple filter devices; other packaging steps; and additional testing. After each filter device is completed, the process ends at 1295.

Throughout this description, the embodiments and examples shown should be considered as examples, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed:

1. An acoustic resonator comprising:

a substrate;

a piezoelectric plate supported by the substrate;

a diaphragm comprising a portion of the piezoelectric plate over a cavity between the piezoelectric plate and the substrate;

an interdigital transducer (IDT) at the piezoelectric plate, the IDT comprising interleaved IDT fingers extending from first and second busbars respectively, wherein overlapping portions of the interleaved IDT fingers define an aperture of the acoustic resonator;

one or more dielectric strips, each of the one or more dielectric strips overlapping at least a portion of each of the IDT fingers and extending into a gap between a margin of the aperture and a corresponding one of the first busbar or the second busbar; and one or more dummy fingers, each of the dummy fingers extending from one busbar of the first busbar or the second busbar at a position between neighboring IDT fingers and extending into the gap toward one of the one or more dielectric strips, wherein a length of each of the one or more dummy fingers is in a range of 25% to 50% of a length of the gap, the length of the gap being measured between the one busbar of the first busbar or the second busbar from which the respective dummy finger extends and the margin of the aperture.

2. The acoustic resonator of claim 1, wherein a distance between a tip of each of the one or more dummy fingers and a corresponding one of the one or more dielectric strips toward which the respective dummy finger extends is between 0 and 3 μm.

3. The acoustic resonator of claim 1, wherein a length of each of the one or more dummy fingers is 50% of the length of the gap.

4. The acoustic resonator of claim 1, wherein a width of each of the one or more dummy fingers is between 75% and 125% of a width of the IDT fingers.

5. The acoustic resonator of claim 1, wherein the piezoelectric plate is one of Z-cut lithium niobate or 82Y-cut lithium niobate.

6. The acoustic resonator of claim 1, wherein the one or more dielectric strips include:

a first dielectric strip that overlaps the IDT fingers in a first margin of the aperture, extends in a length direction over an entire length of the IDT, and extends in a width direction into a first gap between the first margin and the first busbar; and a second dielectric strip that overlaps the IDT fingers in a second margin of the aperture, extends in a length direction over an entire length of the IDT, and extends into a second gap between the second margin and the second busbar.

7. The acoustic resonator of claim 1, wherein:

each of the one or more dielectric strips includes a first portion overlapping the IDT fingers, and a width dol of the first portion has a following relationship to a thickness td of the diaphragm: $0.6td \leq dol \leq 3.0td$.

8. The acoustic resonator of claim 1, wherein a width ds of each of the one or more dielectric strips and a thickness td of the diaphragm are related by: $4.0td \leq ds \leq 15.0td$.

9. The acoustic resonator of claim 1, wherein the piezoelectric plate and the IDT are configured such that a radio frequency signal applied to the IDT excites a primary shear acoustic mode in the piezoelectric plate.

10. An acoustic resonator comprising:

a substrate;

a piezoelectric plate supported by the substrate and including a portion that forms a diaphragm that is over a cavity between the piezoelectric plate and the substrate;

an interdigital transducer (IDT) at the piezoelectric plate, the IDT comprising interleaved IDT fingers extending from first and second busbars respectively, wherein overlapping portions of the interleaved IDT fingers define an aperture of the acoustic resonator;

one or more dielectric strips, each of the one or more dielectric strips overlapping at least a portion of each of the IDT fingers and extending into a gap between a margin of the aperture and a corresponding one of the first busbar or the second busbar; and one or more dummy fingers, each of the dummy fingers extending from one busbar of the first busbar or the second busbar at a position between neighboring IDT fingers and extending into the gap toward one of the one or more dielectric strips, wherein a thickness ts of the one or more dielectric strips and a thickness td of the diaphragm are related by: $0.008td \leq ts \leq 0.06td$.

11. A filter device comprising:

a substrate;

a piezoelectric layer supported by the substrate;

a plurality of diaphragms, each diaphragm comprising a respective portion of the piezoelectric layer over a respective cavity between the piezoelectric layer and the substrate; and a conductor pattern at the piezoelectric layer, the conductor pattern comprising interdigital transducers (IDTs) of a plurality of acoustic resonators, each IDT comprising interleaved IDT fingers extending from first and second busbars respectively, wherein the interleaved IDT fingers are on a respective diaphragm and overlapping portions of the interleaved IDT fingers define an aperture of a respective acoustic resonator of the plurality of acoustic resonators, wherein at least one of the plurality of acoustic resonators further comprises:

one or more dielectric strips, each of the one or more dielectric strips overlapping at least a portion of each of the IDT fingers of the at least one of the acoustic resonators and extending into a gap between a margin of the aperture of the at least one of the acoustic resonators and a corresponding one of the first busbar or the second busbar; and one or more dummy fingers, each of the dummy fingers extending from one of the first busbar or the second busbar at a position between neighboring IDT fingers and extending into the gap toward one of the one or more dielectric strips of the at least one of the acoustic resonators, wherein a length of each of the one or more dummy fingers is in a range of 25% to 50% of a length of the gap, the length of the gap being measured between the one of the first busbar or the second busbar from which the respective dummy finger extends and the margin of the corresponding aperture.

12. The filter device of claim 11, wherein a distance between a tip of each of the one or more dummy fingers and a corresponding one of the one or more dielectric strips toward which the respective dummy finger extends is 0-3 μm.

13. The filter device of claim 11, wherein a length of each of the one or more dummy fingers is 50% of the length of the gap.

14. The filter device of claim 11, wherein a width of each of the one or more dummy fingers is between 75% and 125% of a width of the IDT fingers of the corresponding acoustic resonator.

15. The filter device of claim 11, wherein the piezoelectric layer is one of Z-cut lithium niobate or 82Y-cut lithium niobate.

16. The filter device of claim 11, wherein the one or more dielectric strips include:

a first dielectric strip that overlaps the IDT fingers in a first margin of the aperture of the corresponding acoustic resonator, extends in a length direction over an entire length of the IDT, and extends in a width direction into a first gap between the first margin and the first busbar; and a second dielectric strip that overlaps the IDT fingers in a second margin of the aperture of the corresponding acoustic resonator, extends in a length direction over an entire length of the IDT, and extends into a second gap between the second margin and the second busbar.

17. The filter device of claim 11, wherein a thickness ts of the one or more dielectric strips and a thickness td of the diaphragms are related by: $0.008td < ts < 0.06td$.

18. The filter device of claim 11, wherein each of the IDTs is configured such that a radio frequency signal applied to the IDT excites a primary shear acoustic mode in the piezoelectric layer.

* * * * *